US007033722B2

(12) United States Patent
Hoshi et al.

(10) Patent No.: US 7,033,722 B2
(45) Date of Patent: Apr. 25, 2006

(54) LITHOGRAPHIC PRINTING PLATE PRECURSOR

(75) Inventors: Satoshi Hoshi, Shizuoka (JP); Gaku Kumada, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 32 days.

(21) Appl. No.: 10/225,168

(22) Filed: Aug. 22, 2002

(65) Prior Publication Data

US 2003/0138721 A1 Jul. 24, 2003

(30) Foreign Application Priority Data

Aug. 24, 2001 (JP) .......................... P.2001-254728
Aug. 27, 2001 (JP) .......................... P.2001-256270

(51) Int. Cl.
*G03F 7/004* (2006.01)

(52) U.S. Cl. ................ 430/138; 430/270.1; 430/281.1; 430/286.1; 430/287.1; 430/288.1

(58) Field of Classification Search ................ 430/138, 430/270.1, 281.1, 286.1, 287.1, 288.1
See application file for complete search history.

(56) References Cited

U.S. PATENT DOCUMENTS

| | | | | |
|---|---|---|---|---|
| 5,569,573 | A | 10/1996 | Takahashi et al. | |
| 5,658,708 | A * | 8/1997 | Kondo | 430/288.1 |
| 6,030,750 | A | 2/2000 | Vermeersch et al. | |
| 6,632,580 | B1 * | 10/2003 | Maemoto | 430/138 |

FOREIGN PATENT DOCUMENTS

EP 1 160 083 A2 * 12/2001

* cited by examiner

*Primary Examiner*—Amanda Walke
(74) *Attorney, Agent, or Firm*—Buchanan Ingersoll PC

(57) ABSTRACT

There is provided a lithographic printing plate precursor having good on-machine development quality, and moreover high sensitivity and high printing durability, which comprises a support having provided thereon an image forming layer containing (1) at least one ingredient selected from the group consisting of fine particles containing a compound having two or more vinyloxy groups and microcapsules encapsulating a compound having two or more vinyloxy groups, (2) a light-to-heat conversion agent, (3) a hydrophilic resin and (4) an acid precursor, wherein the acid precursor is not contained in the fine particles or the microcapsules.

5 Claims, No Drawings

LITHOGRAPHIC PRINTING PLATE PRECURSOR

FIELD OF THE INVENTION

The present invention relates to a negative lithographic printing plate precursor having a hydrophilic image forming layer on a support. More particularly, the present invention relates to a lithographic printing plate precursor that can record an image by infrared scanning exposure based on a digital signal and can be mounted on a printing machine after image recording as such to conduct platemaking by on-machine development (i.e., on-press development).

BACKGROUND OF THE INVENTION

Many studies have been conducted on printing plates for the computer-to-palate system whose recent development is remarkable. Of these, as ones directed toward more process rationalization and the solution to the problem of waste liquid disposal, lithographic printing plate precursors that can be mounted on a printing machine and printed as such without development processing after exposure have been studied, and various methods have been proposed.

As one of methods dispensing with development processing, there is a method called on-machine (i.e., on-press) development in which an exposed printing plate precursor is mounted on a cylinder of a printing machine and a fountain solution and ink are supplied while rotating the cylinder, thereby removing a non-image area of the printing plate precursor. That is to say, this is a system in which the printing plate precursor is mounted as such after exposure and processing is completed in the ordinary printing process.

The printing plate precursor suitable for such on-machine development is required to have a light-sensitive layer soluble in a fountain solution and ink, and to have bright-room handling properties suitable for development on the printing machine placed in a bright room.

For example, Japanese Patent 2,938,387 discloses a lithographic printing plate precursor comprising a hydrophilic support having provided thereon a light-sensitive layer in which fine particles of a thermoplastic hydrophobic polymer are dispersed in a hydrophilic binder polymer. This patent describes that the fine particles of the thermoplastic hydrophobic polymer are exposed to an infrared laser beam to allow them to coalesce by heat in the lithographic printing plate precursor to form an image, followed by mounting of the precursor on a cylinder of a printing machine, thus being able to conduct on-machine development with a fountain solution and/or ink.

Further, Japanese Patent (Application) Laid-Open No. 127683/1997 and WO99-10186 also describe that thermoplastic fine particles are allowed to coalesce by heat, followed by the preparation of a printing plate by on-machine development.

However, the methods of forming images by fusion of the fine particles by heat as described above have the problems of low sensitivity and difficulty in obtaining high printing durability.

SUMMARY OF THE INVENTION

An object of the present invention is to solve these problems, that is to say, to provide a lithographic printing plate precursor having good on-machine development quality, and moreover having high sensitivity and high printing durability (i.e., high press life).

The object of the present invention is attained by means having the following constitution:

1. A lithographic printing plate precursor comprising a support having provided thereon an image forming layer containing (1) at least one ingredient selected from the group consisting of fine particles containing a compound having two or more vinyloxy groups and microcapsules encapsulating a compound having two or more vinyloxy groups, (2) a light-to-heat conversion agent, (3) a hydrophilic resin and (4) an acid precursor, wherein the acid precursor is not contained in the fine particles or the microcapsules;

2. The lithographic printing plate precursor described in the above 1, wherein the above-mentioned fine particles or microcapsules contain the light-to-heat conversion agent;

3. The lithographic printing plate precursor described in the above 1 or 2, wherein the above-mentioned light-to-heat conversion agent is a cyanine dye;

4. The lithographic printing plate precursor described in the above 1, wherein the above-mentioned acid precursor is an onium salt compound;

5. The lithographic printing plate precursor described in the above 1, wherein the above-mentioned fine particles or microcapsules contain a compound having a functional group reactable with the above-mentioned vinyloxy group;

6. The lithographic printing plate precursor described in the above 1, wherein the above-mentioned hydrophilic resin has a functional group reactable with the above-mentioned vinyloxy group;

7. The lithographic printing plate precursor described in the above 1, which further contains (5) fine resin particles containing a compound having a functional group which is crosslinked with the above-mentioned vinyloxy group by heat, and wherein the acid precursor is not contained in the fine particles or the microcapsules;

8. The lithographic printing plate precursor described in the above 7, wherein the fine resin particles or microcapsules in (1) of the above 7 encapsulate (2) the light-to-heat conversion agent;

9. The lithographic printing plate precursor described in the above 7 or 8, wherein the light-to-heat conversion agent is a cyanine dye;

10. The lithographic printing plate precursor described in the above 7, 8 or 9, wherein the acid precursor is an onium salt compound; and 11. The lithographic printing plate precursor described in the above 7, 8, 9 or 10, wherein the functional group crosslinked with the vinyloxy group by heat in (5) of the above 7 is an acidic group or a hydroxyl group.

DETAILED DESCRIPTION OF THE INVENTION

The present invention will be described in detail below.

[Image Forming Layers]

The image forming layer of the lithographic printing plate precursor of the present invention contains (1) at least one ingredient selected from the group consisting of fine particles containing a compound having two or more vinyloxy groups (hereinafter also briefly referred to as a vinyloxy group-containing compound) and microcapsules encapsulating a compound having two or more vinyloxy groups, (2) a light-to-heat conversion agent, (3) a hydrophilic resin and (4) an acid precursor.

The above-mentioned compound contained in the above-mentioned fine particles or microcapsules has two or more vinyloxy groups, whereby an exposed area of the image forming layer can be effectively crosslinked to achieve the effect of the present invention.

The image forming layer further contains (5) fine resin particles containing a compound having a functional group crosslinkable with the above-mentioned vinyloxy group by heat, in addition to the above-mentioned ingredients of (1), (2), (3) and (4), whereby an exposed area of the image forming layer can be more effectively crosslinked to more achieve the effect of the present invention.

The above-mentioned vinyloxy group is represented by general formula (I):

(I)

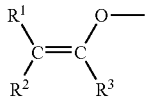

wherein $R^1$, $R^2$ and $R^3$, which may be the same or different, each represents a hydrogen atom, an alkyl group or an aryl group, and two of them may combine with each other to form a saturated or olefinic unsaturated ring.

More particularly, when any one of $R^1$, $R^2$ and $R^3$ is an aryl group in general formula (I), the aryl group generally has from 6 to 20 carbon atoms, and may be substituted by an alkyl group, an aryl group, an alkoxyl group, an aryloxy group, an acyl group, an acyloxy group, an alkylmercapto group, an acylamino group, an alkoxycarbonyl group, a nitro group, a sulfonyl group, a cyano group or halogen atom.

When any one of $R^1$, $R^2$ and $R^3$ is an alkyl group or an alkenyl group, the group is generally a branched or heterocyclic carbon chain group having from 1 to 20 carbon atoms, and may be substituted by a halogen atom, a cyano group, an alkoxycarbonyl group, a hydroxyl group, an alkoxyl group, an aryloxy group or aryl group. Further, when any two of $R^1$, $R^2$ and $R^3$ combine with each other to from a ring together with the carbon atom or the carbon atoms of the vinyl group, the ring is usually a ring having from 3 to 8, and preferably a saturated or unsaturated ring having 5 or 6 carbon atoms.

In the present invention, of the vinyloxy groups represented by general formula (I), more preferred is a vinyloxy group in which any one of $R^1$, $R^2$ and $R^3$ is a methyl group or an ethyl group, and the remaining groups are hydrogen atoms, particularly preferred is a vinyloxy group (vinyl ether group) in which all of $R^1$, $R^2$ and $R^3$ are hydrogen atoms.

The vinyloxy group-containing compound used in the present invention is a compound having a boiling point of 60° C. or more at atmospheric pressure, and preferred examples thereof include a compounds represented by general formula (II) or (III)

$$A\text{-}[—O—(R^4—O)n—CH{=}CH_2]m \quad \text{(II)}$$

$$A\text{-}[—B—R^4—O—CH{=}CH_2]m \quad \text{(III)}$$

wherein A represents an alkyl group, an aryl group or a heterocyclic group, B represents —C—O—O—, —NH-COO— or —NHCONH—, $R^4$represents a straight-chain or branched alkylene group having from 1 to 10 carbon atoms, n represents an integer of 0 or from 1 to 10, and m represents an integer of from 2 to 6.

The compound represented by general formula (II) can be synthesized by a method described in Stephen C. Lapin, *Polymers Paint Colour Journal*, 179 (4273), 321 (1988), that is to say, the reaction of a polyhydric alcohol or a polyhydric phenol with acetylene, or the reaction of a polyhydric alcohol or a polyhydric phenol with an alkyl vinyl ether halide.

Specific examples thereof include but are not limited to ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, trimethylolpropane ethylene vinyl ether, trimethylolpropane diethylene vinyl ether, pentaerythritol diethylene vinyl ether, pentaerythritol triethylene vinyl ether, pentaerythritol tetraethylene vinyl ether, 1,2-di(vinyl ether methoxy)benzene, 1,2-di(vinyl ether ethoxy)benzene and compounds represented by the following general formulas (M-1) to (M-41):

(M-1)

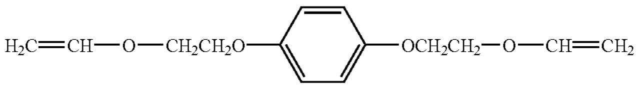

(M-2)

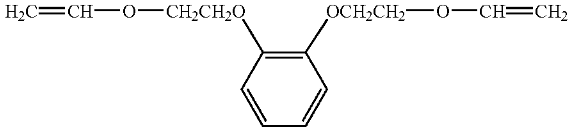

(M-3)

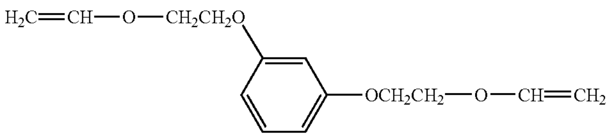

(M-4)

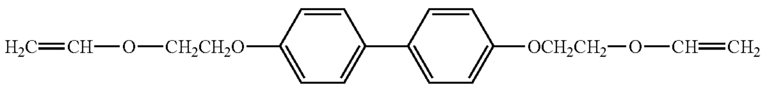

-continued
(M-5)
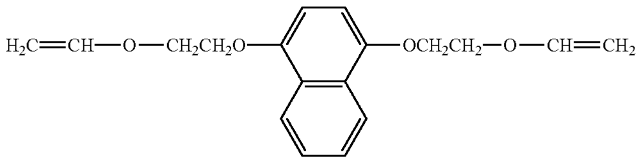
(M-6)
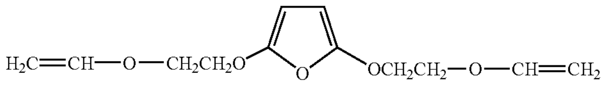
(M-7)
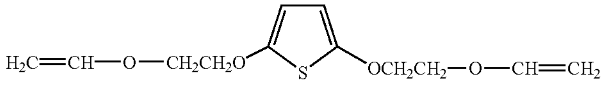
(M-8)
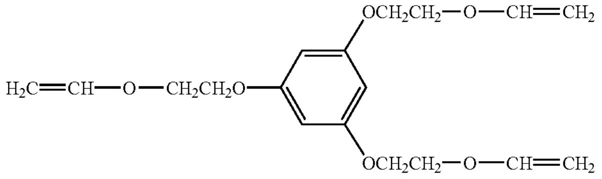
(M-9)
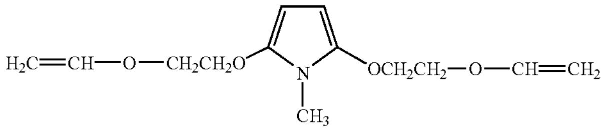
(M-10)
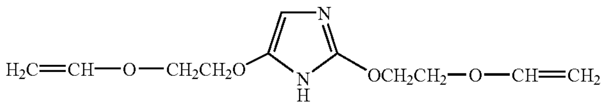
(M-11)
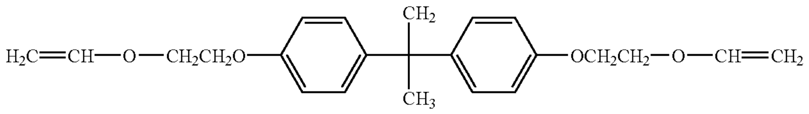
(M-12)
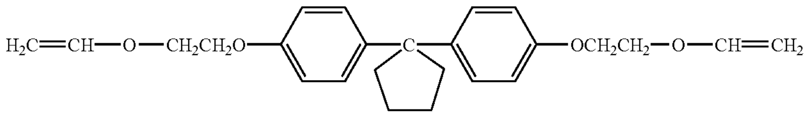
(M-13)
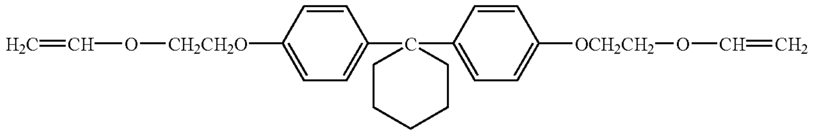
(M-14)
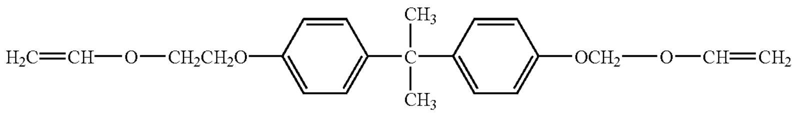
(M-15)
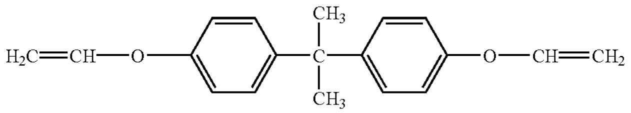
(M-16)
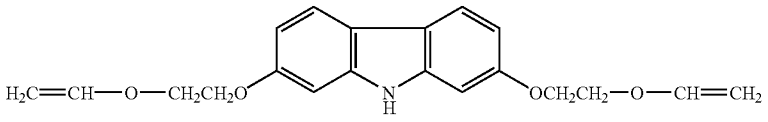

-continued
(M-17)
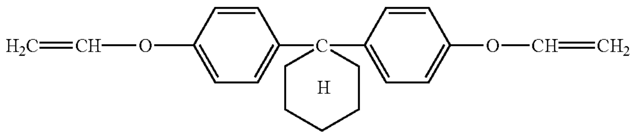
(M-18)
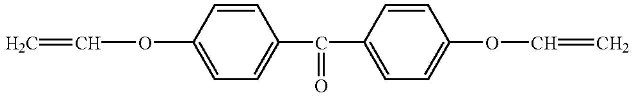
(M-19)
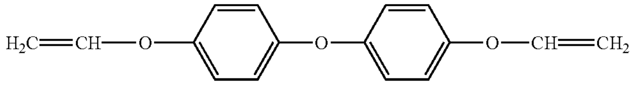
(M-20)
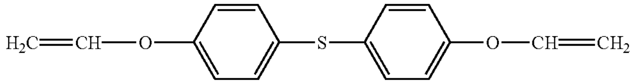
(M-21)
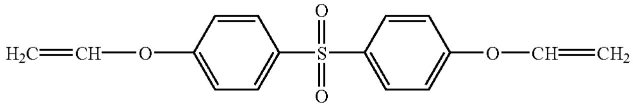
(M-22)
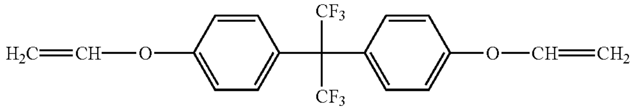
(M-23)
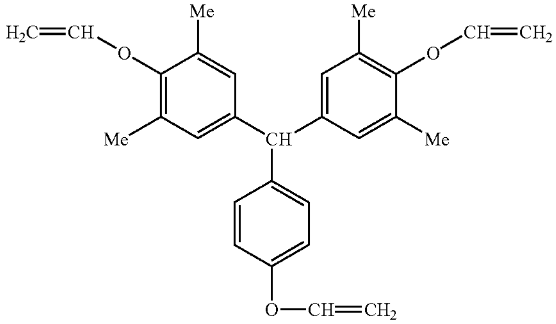
(M-24)
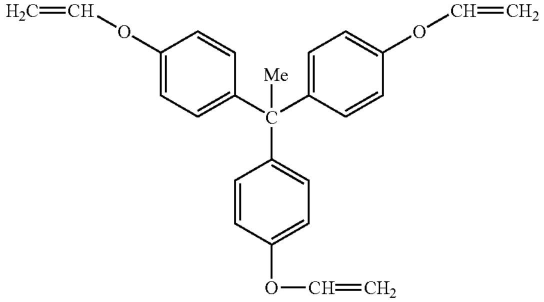
(M-25)
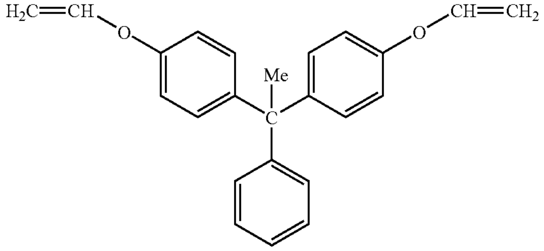

-continued
(M-26)
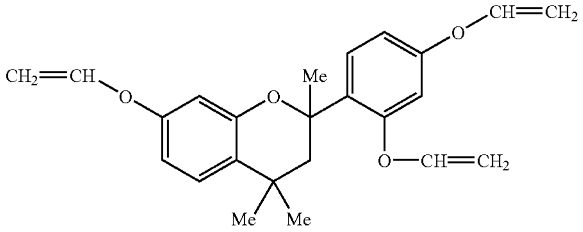
(M-27)
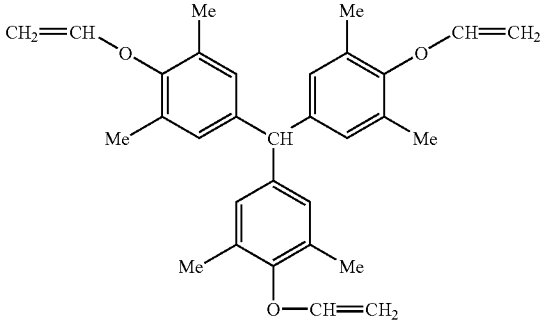
(M-28)
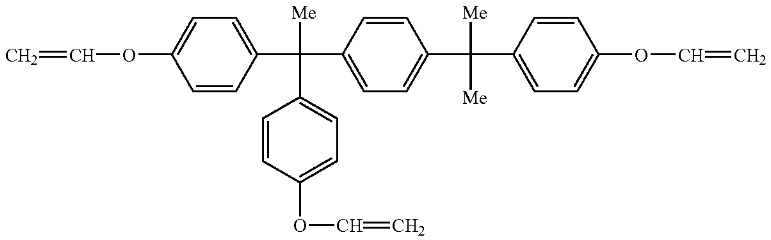
(M-29)
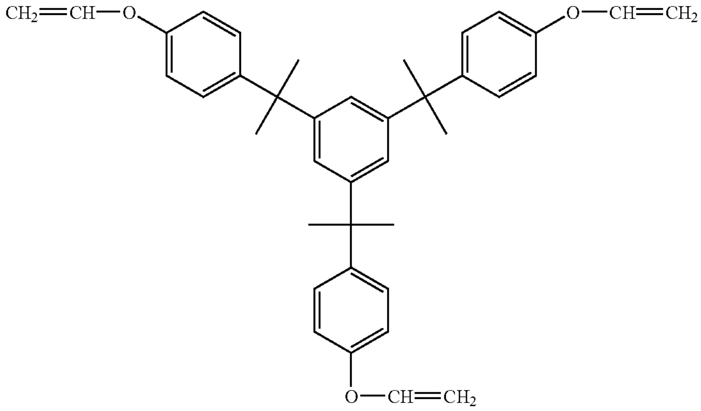
(M-30)
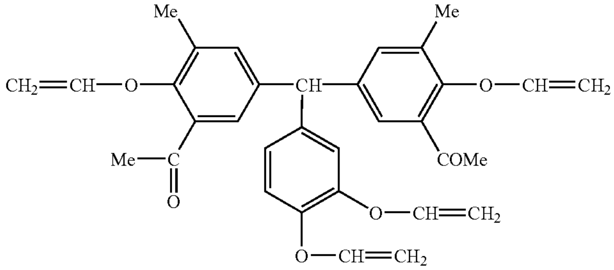

-continued
(M-31)
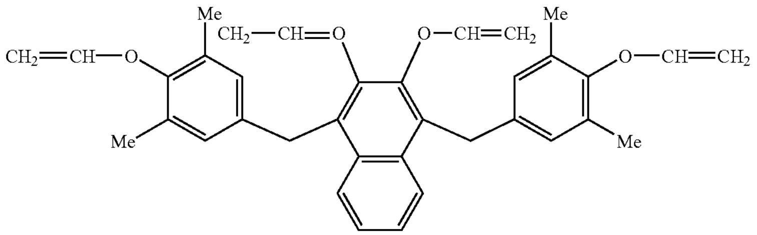
(M-32)
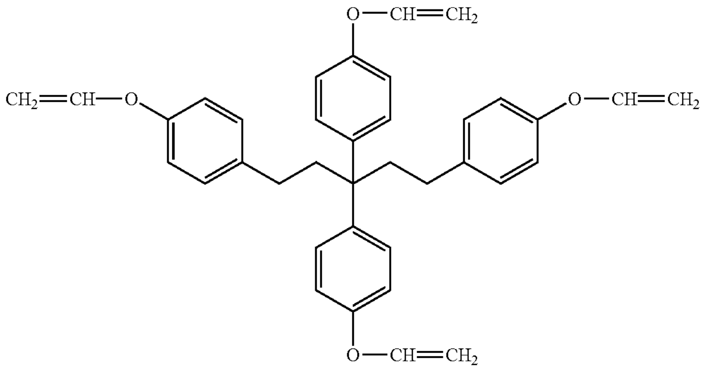
(M-33)
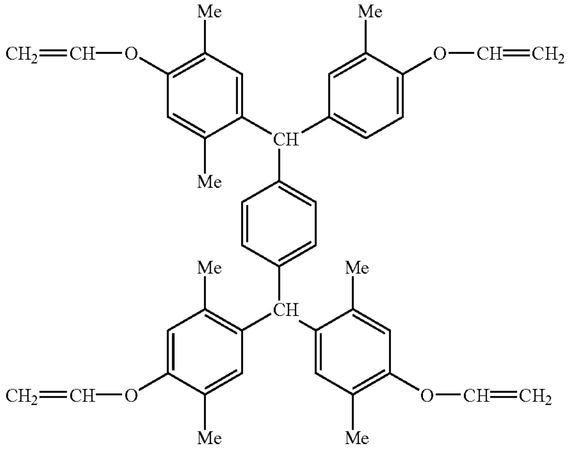
(M-34)
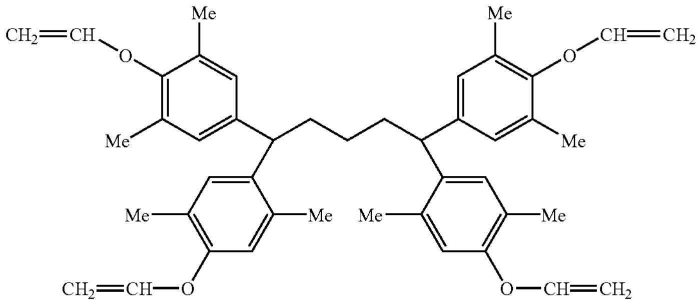
(M-35)
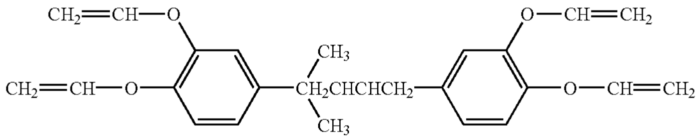

-continued (M-36)

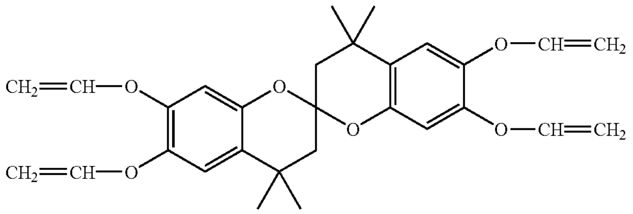

(M-37)

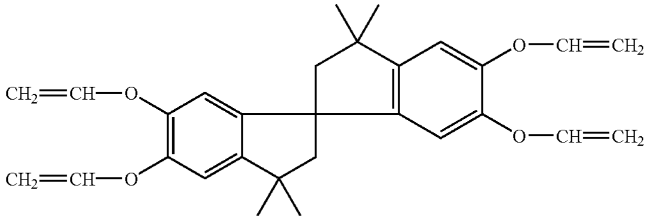

(M-38)

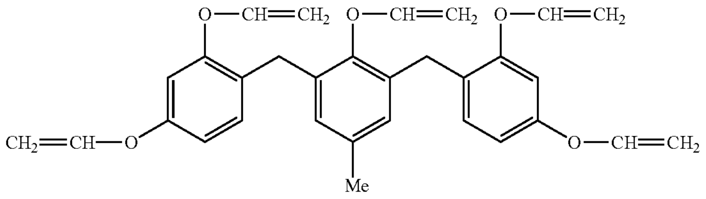

(M-39)

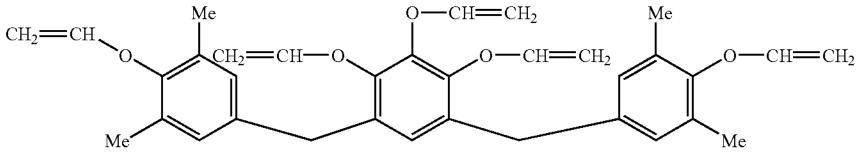

(M-40)

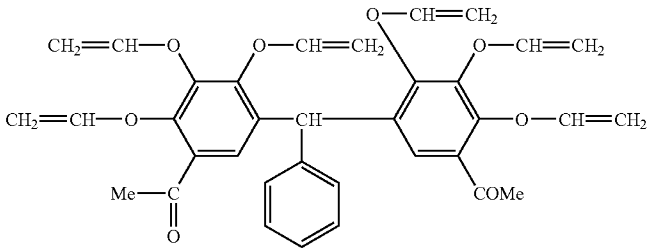

(M-41)

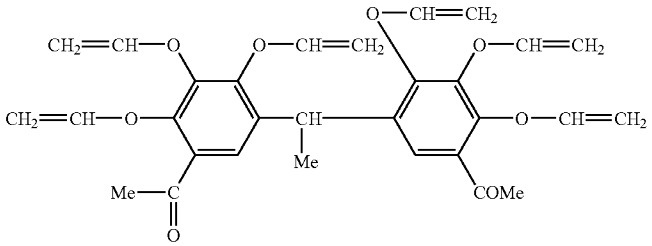

On the other hand, the compound represented by general formula (III) (in the case of B═CO—O—) can be produced by the reaction of a multivalent carboxylic acid with an alkyl vinyl ether halide. Specific examples thereof include but are not limited to diethylene vinyl ether terephthalate, diethylene vinyl ether phthalate, diethylene vinyl ether isophthalate, dipropylene vinyl ether phthalate, dipropylene vinyl ether terephthalate, dipropylene vinyl ether isophthalate, diethylene vinyl ether maleate, diethylene vinyl ether fumarate and diethylene vinyl ether itaconate.

The vinyloxy-group containing compounds preferably used in the present invention further include a vinyloxy group-containing compound synthesized by the reaction of an active hydrogen-containing vinyloxy compound represented by the following general formula (IV), (V) or (VI) with an isocyanate group-containing compound:

$$CH_2{=}CH{-}O{-}R^5{-}OH \quad (IV)$$

$$CH_2{=}CH{-}O{-}R^5{-}COOH \quad (V)$$

$$CH_2{=}CH{-}O{-}R^5{-}NH_2 \quad (VI)$$

wherein $R^5$ represents a substituted or unsubstituted straight-chain or branched alkylene group. As the isocyanate-group containing compound, there can be used, for example, a compound described in *Crosslinking Agent Handbook* (published by Taisei-sha, 1981).

Specific examples thereof include a polyisocyanate type compound such as triphenylmethane triisocyanate, diphenyl-methane diisocyanate, tolylene diisocyanate, a dimmer of 2,4-tolylene diisocyanate, naphthalene-1,5-diisocyanate, o-tolylene diisocyanate, polymethylene polyphenyl isocyanate or hexamethylene diisocyanate, and a polyisocyanate adduct type compound such as an adduct of tolylene diisocyanate and trimethylolpropane, an adduct of hexamethylene diisocyanate and water, or an adduct of xylylene diisocyanate and trimethylolpropane.

Various compounds having vinyloxy groups at their ends can be obtained by allowing the above-mentioned isocyanate group-containing compounds to react with compounds containing active hydrogen atom-containing vinyloxy groups. Examples of the vinyloxy group-containing compounds used in the present invention ((M-42) to (M-56)) are enumerated below, but the scope of the present invention is not limited thereto.

(M-42)

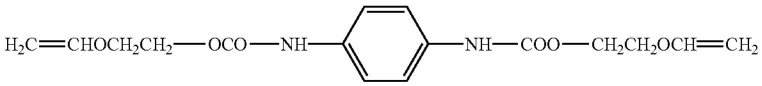

(M-43)

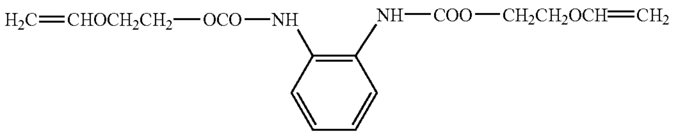

(M-44)

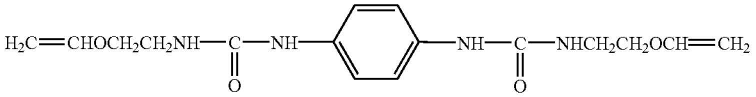

(M-45)

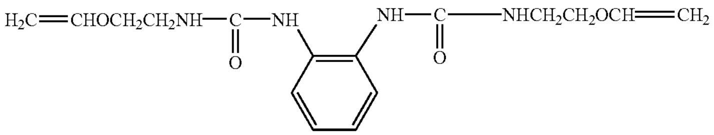

(M-46)

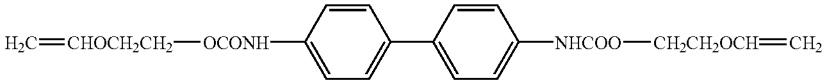

(M-47)

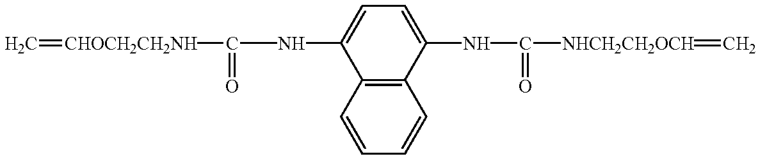

(M-48)

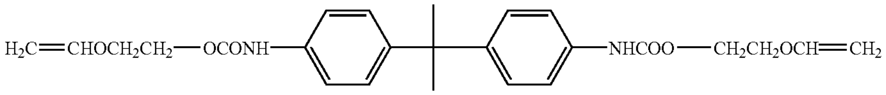

(M-49)

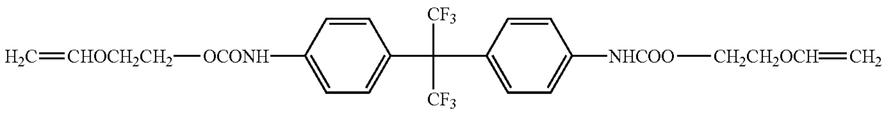

(M-50)

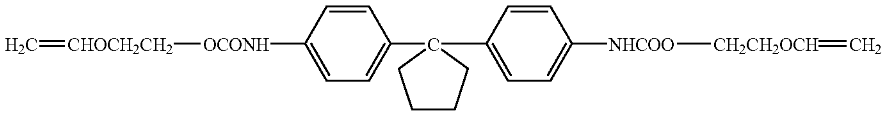

(M-51)

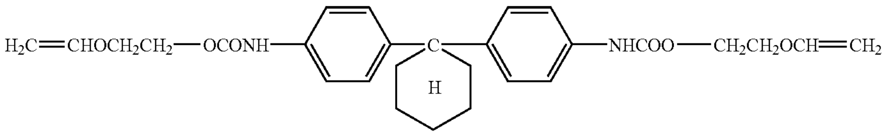

-continued
(M-52)
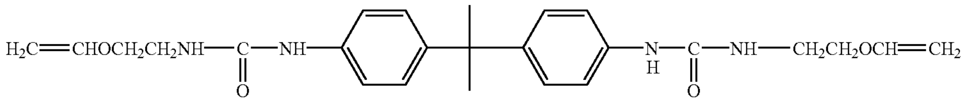
(M-53
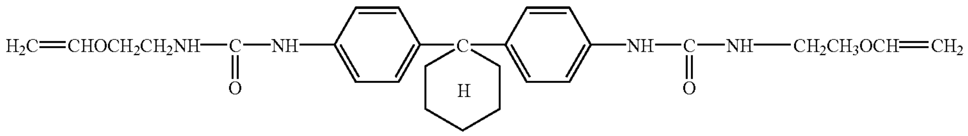
(M-54)
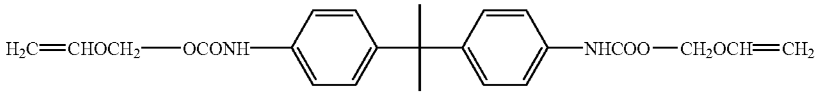
(M-55)
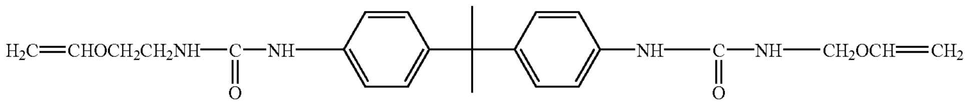
(M-56)
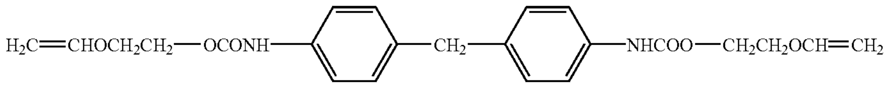
Further, preferred examples of the vinyloxy group-containing compounds used in the present invention conclude polymers having vinyloxy groups on their side chains. Specific examples thereof include the following polymers:
(P-1)
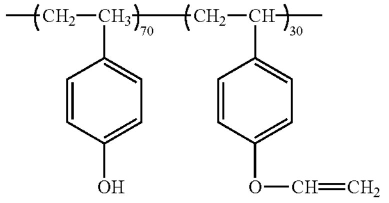
(P-2)
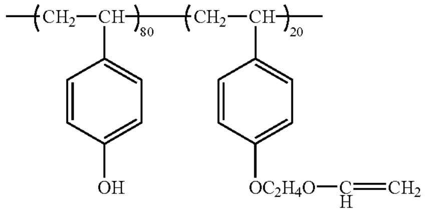
(P-3)
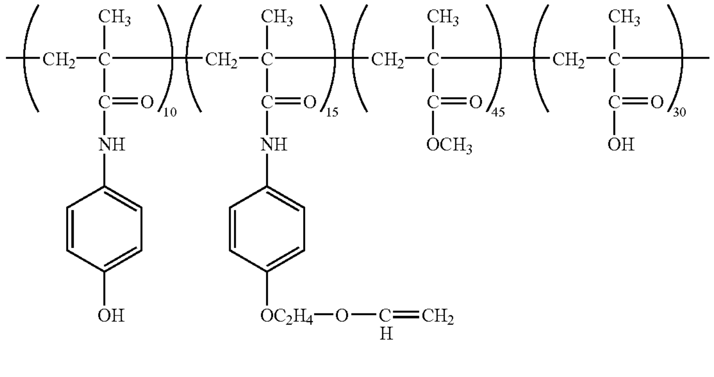

-continued
(P-4)
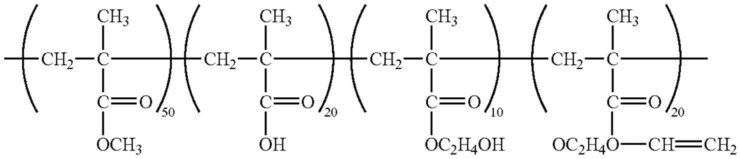
(P-5)
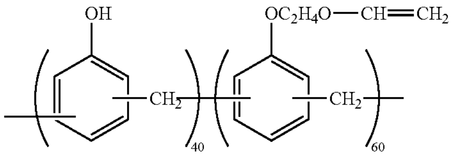
(P-6)
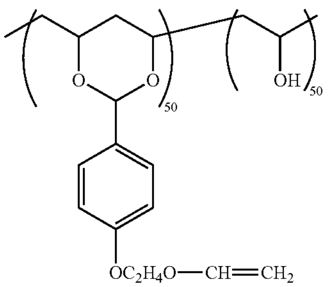
(P-7)
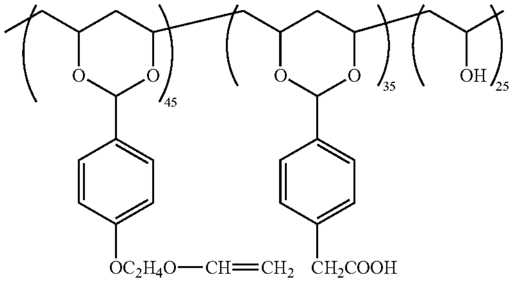
(P-8)
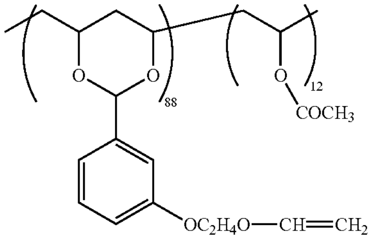
(P-9)
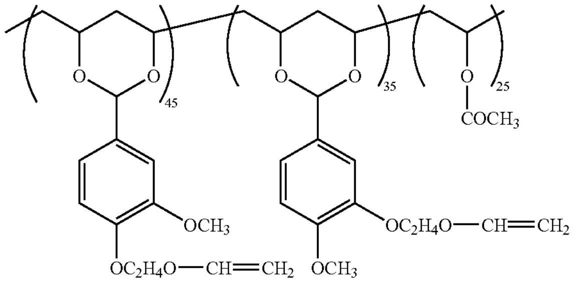

-continued
(P-10)
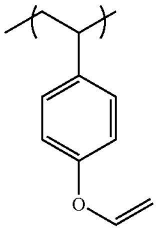
(P-11)
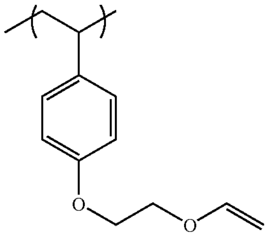
(P-12)
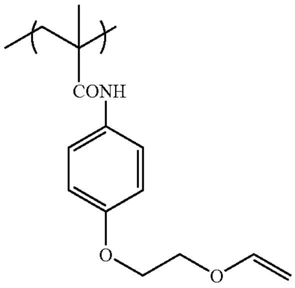
(P-13)
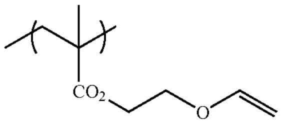
(P-14)
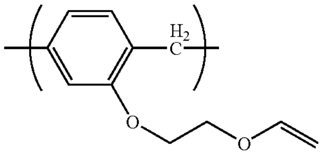
(P-15)
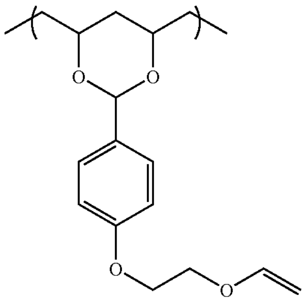

-continued (P-16)

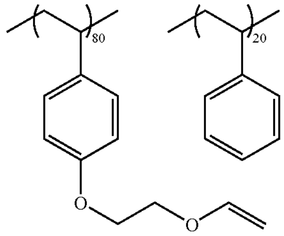

In the present invention, the above-mentioned vinyloxy group-containing compound is added to the image forming layer as fine particles containing it or microcapsules encapsulating it.

The fine particles containing the vinyloxy group-containing compound(s) (hereinafter also referred to as fine resin particles (1)) are obtained, for example, by a solvent evaporation method in which the vinyloxy group-containing compound(s) is dissolved alone (or as a mixture of two or more of them) in a water-insoluble organic solvent, the resulting solution is mixed with an aqueous solution containing a dispersing agent to emulsify it, and the compound(s) is solidified in the fine particle form while evaporating the organic solvent by application of heat. However, the method is not limited thereto.

In the present invention, at least one ingredient of a light-to-heat conversion agent and a compound having a functional group reactable with the vinyloxy group is also suitably allowed to coexist together with the vinyloxy group-containing compound in the fine particles. When the vinyloxy group-containing compound is dissolved in the water-insoluble organic solvent according to the above-mentioned solvent evaporation method, such fine particles are obtained by dissolving the light-to-heat conversion agent, the acid precursor, an organic solvent-soluble polymer and the like together, and conducting the solvent evaporation method.

As methods for micro encapsulating the vinyloxy group-containing compound, well-known methods are applicable. Methods for producing the microcapsules include but are not limited to, for example, a method utilizing coacervation as shown in U.S. Pat. Nos. 2,800,457 and 2,800,458, a method according to interface polymerization as shown in British Patent 990,443, U.S. Pat. No. 3,287,154, Japanese Patent Publication Nos. 19574/1963, 446/1967 and 711/1967, a method according to polymer precipitation as shown in U.S. Pat. Nos. 3,418,250 and 3,660,304, a method using an isocyanate polyol wall material as shown in U.S. Pat. No. 3,796,669, a method using an isocyanate wall material as shown in U.S. Pat. No. 3,914,511, a method using a urea-formaldehyde or urea-formaldehyde-resorcinol wall-forming material as shown in U.S. Pat. Nos. 4,001,140, 4,087,376 and 4,089,802, a method using a wall material such as a melamine-formaldehyde or hydroxy cellulose as shown in U.S. Pat. No. 4,025,445, an in situ method according to monomer polymerization as shown in Japanese Patent Publication Nos. 9163/1961 and 9079/1976, a spray drying method as shown in British Patent 930,422 and U.S. Pat. No. 3,111,407, and an electrolytic dispersion cooling method as shown in British Patents 952,807 and 967,074.

The microcapsule wall preferably used in the present invention has three-dimensional bridging and the property of swelling with a solvent. From such viewpoints, the wall materials of the microcapsules are preferably a polyurea, a polyurethane, a polyester, a polycarbonate, a polyamide and a mixture thereof, and particularly preferably a polyurea and a polyurethane.

In the microcapsules used in the present invention, a solvent that dissolves the encapsulated compound and swells the wall material can be added to a dispersing medium in synthesizing them. This solvent accelerates the diffusion of the encapsulated compound outside the microcapsules.

Such a solvent can be easily selected from many commercially available solvents, although it depends on the dispersing medium of the microcapsules, the wall material of the microcapsules, the wall thickness and the encapsulated compound. For example, in the case of water-dispersible microcapsules composed of cross-linked polyurea or polyurethane walls, preferred is an alcohol, an ether, an acetal, an ester, a ketone, a polyhydric alcohol, an amide, an amine or a fatty acid.

Specific examples thereof include but are not limited to methanol, ethanol, tertiary butanol, n-propanol, tetra-hydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide and N,N-dimethylacetamide. These solvents may be used as a combination of two or more of them.

A solvent that is insoluble in a microcapsule dispersion but soluble when mixed with the above-mentioned solvent can also be used. The amount thereof added is determined depending on the combination of raw materials. Less than a proper value results in insufficient image formation, whereas more than the proper value results in deterioration of stability of the dispersion. Usually, it is effectively from 5% to 95% by weight based on a coating solution. The range thereof is preferably from 10% to 90% by weight, and more preferably from 15% to 85% by weight.

The average particle size of the above-mentioned fine particles or microcapsules containing the vinyloxy group-containing compound is preferably from 0.01 to 3.0 μm, more preferably from 0.05 to 2.0 μm, and particularly preferably from 0.08 to 1.0 μm. Good resolution and aging stability are obtained within this range.

The amount of these fine particles or microcapsules added is preferably 50% by weight or more, and more preferably 60% by weight or more, based on solid matter contained in the image forming layer. Good sensitivity and printing durability (i.e., press life), as well as good on-machine development quality, are obtained within this range.

The fine particles used in the present invention that contain the vinyloxy group-containing compound can contain a compound having a functional group crosslinkable with the vinyloxy group by heat. That is to say, the image forming layer of the lithographic printing plate precursor of the present invention also contains fine resin particles containing the compound having the functional group crosslinkable with the above-mentioned vinyloxy group by heat (hereinafter also referred to as fine resin particles (5)).

The functional group crosslinkable with the vinyloxy group by heat, in which the above-mentioned compound has and which is contained in fine resin particles (5), is preferably a carboxyl group or a hydroxyl group. The above-mentioned functional group-containing compound used in the present invention is preferably a compound having two or more of these functional groups, including a low-molecular compound and a high-molecular compound.

Specific example of such low-molecular compounds include 1,4-bis(2-hydroxyethyloxy)benzene, 1,3,5-tris(2-hydroxy-ethyloxy)benzene, bisphenol A, 2,2-bis(4-hydroxymethyloxy-phenyl)propane, 2,2-bis(4-(2-hydroxy-ethyloxy)phenyl)propane, 4,4'-bis(2-hydroxyethyloxy) biphenyl and 1,1,1-tris(4-hydroxyphenyl)ethane.

The high-molecular compounds reactable with the vinyloxy group include polymers or copolymers of carboxyl group-containing monomers such as acrylic acid, methacrylic acid, maleic acid, itaconic acid, crotonic acid, isocrotonic acid, p-vinylbenzoic acid, p-vinylcinnamic acid and monomethyl maleate, and polymers or copolymers of hydroxyl group-containing monomers such as 2-hydroxyethyl acrylate, 2-hydroxyethyl methacrylate, p-hydroxystyrene, hydroxy-styrene halide, N-(4-hydroxyphenyl) acrylamide, N-(4-hydroxy-phenyl) methacrylamide, (4-hydroxyphenyl) acrylate and (4-hydroxyphenyl) methacrylate.

Further, as the high-molecular compound reactable with the vinyloxy group, there can be used a copolymer with another monomer copolymerizable with the above-mentioned monomer. Examples of such copolymerizable monomers include but are not limited to acrylonitrile, acrylamide, methacrylamide, methyl acrylate, ethyl acrylate, propyl acrylate, butyl acrylate, benzyl acrylate, methyl methacrylate, ethyl methacrylate, propyl methacrylate, butyl methacrylate, benzyl methacrylate, vinyl benzoate, vinyl chloride, vinylidene chloride, styrene, vinyl acetate, butadiene, chloroprene and isoprene.

The high-molecular compounds reactable with the vinyloxy group further include a linear polymer having a carboxyl group and a hydroxyl group obtained by copolycondensation of a carboxyl group-containing dihydroxy compound and a dicarboxylic acid compound. For example, a carboxyl group-containing linear polyurethane resin is obtained by reacting a carboxyl group-containing dihydroxy compound such as 3,5-dihydroxybenzoic acid, 2,2-bis(hydroxymethyl)propionic acid, 2,2-bis(hydroxyethyl)propionic acid, 2,2-bis-(hydroxypropyl)propionic acid, bis(hydroxymethyl) acetic acid, bis(4-hydroxyphenyl)acetic acid, 4,4-bis(4-hydroxyphenyl)-pentanoic acid or tartaric acid with a diisocyanate compound such as 2,4-tolylene diisocyanate, a dimer of 2,4-tolylene diisocyanate, 4,4'-diphenylmethane diisocyanate, 1,5-naphthylene diisocyanate, hexamethylene diisocyanate, trimethylhexamethylene diisocyanate or 4,4'-methylenebis-(cyclohexyl isocyanate) in the equivalent amount. Further, a diol compound having no carboxyl group, which may have another substituent group unreactive to an isocyanate, such as ethylene glycol, diethylene glycol, triethylene glycol, neopentyl glycol, 1,3-butylene glycol, bisphenol A, hydrogenated bisphenol A, hydrogenated bisphenol F and an ethylene oxide adduct of bisphenol A, may be used in combination therewith.

The high-molecular compounds reactable with the vinyloxy group still further include a carboxyl group-containing polyester obtained by copolycondensation of the above-mentioned carboxyl group-containing diol, and the above-mentioned additional diol and a bifunctional carboxylic acid such as phthalic acid, isophthalic acid, terephthalic acid, fumaric acid, itaconic acid or adipic acid as needed.

The high-molecular compounds reactable with the vinyloxy group yet still further include a novolak resin such as a phenol-formaldehyde resin, m-cresol-formaldehyde resin, p-cresol-formaldehyde resin, o-cresol-formaldehyde resin, a m-/p-cresol-formaldehyde resin or a phenol/cresol-formaldehyde resin, a resol type phenol resin, and a phenol resin such as a phenol-modified xylene resin.

Specific examples of these compounds are enumerated below, but the scope of the present invention is not limited thereto:

(M-59)

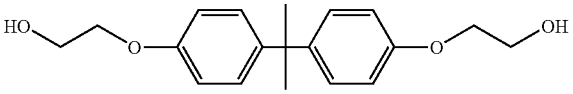

(P-17)

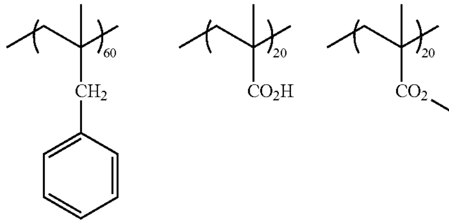

(P-18)

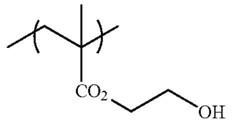

(P-19)

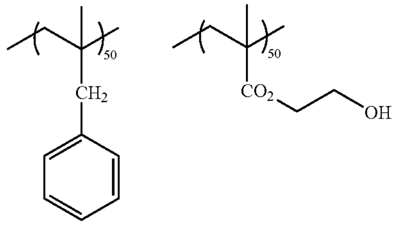

(P-20)

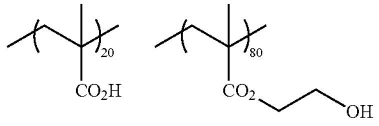

(P-21)

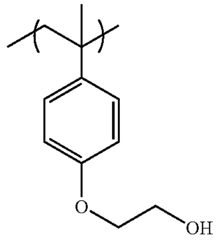

-continued (P-22)

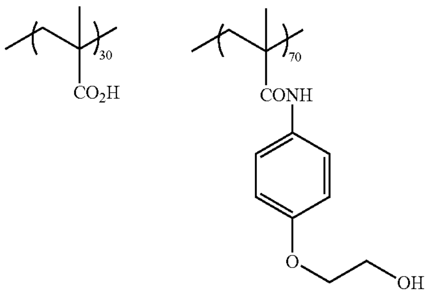

(P-23)

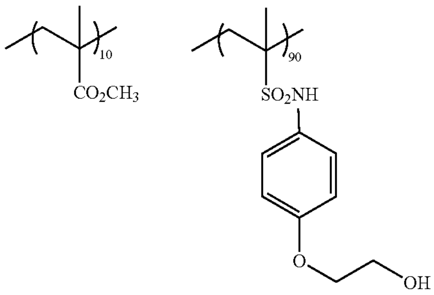

(P-24)

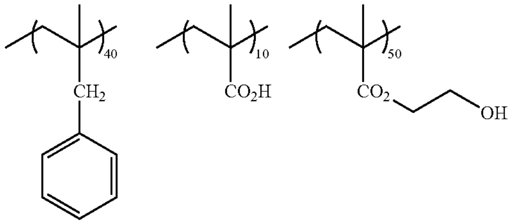

(P-25)

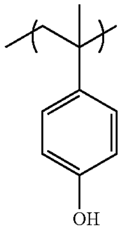

(P-26)

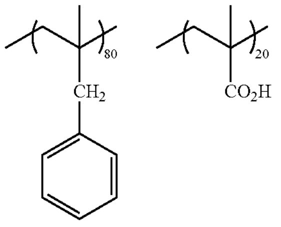

Fine resin particles (5) can be obtained in the same manner as with fine resin particles (1) described above.

The microcapsules encapsulating the vinyloxy group-containing compound used in the present invention can encapsulate the compound having a functional group reactable with the vinyloxy group. In the case of the microcapsules, the functional group is preferably a hydroxyl group, and the hydroxyl group-containing compounds illustrated in the case of the above-mentioned fine resin particles containing the vinyloxy group-containing compound can be suitably used.

The amount of the compound reactable with the vinyloxy group added is preferably from 1% to 95% by weight, more preferably from 20% to 90% by weight, and most preferably from 30% to 80% by weight, based on solid matter contained in the microcapsules.

The image forming layer used in the present invention contains a hydrophilic resin, in order to improve on-machine development quality and the film strength of the image forming layer itself.

As the hydrophilic resin, preferred is a resin having a hydrophilic group such as a hydroxyl group, a carboxyl group, a phosphate group, a sulfonate group or an amido group. The hydrophilic resin is reacted with the vinyloxy group to be crosslinked, thereby increasing image strength and printing durability. Accordingly, a resin having a functional group reactable with the vinyloxy group, such as a hydroxyl group, a carboxyl group, a phosphate group or a sulfonate group, is preferably used. Of these, a hydrophilic resin having a hydroxyl group or a carboxyl group is preferred.

Specific examples of the hydrophilic resins include gum arabic, casein, gelatin, a starch derivative, soya gum, hydroxypropyl cellulose, methyl cellulose, carboxymethyl cellulose and a sodium salt thereof, cellulose acetate, sodium alginate, a vinyl acetate-maleic acid copolymer, a styrene-maleic acid copolymer, a polyacrylic acid and a salt thereof, a polymethacrylic acid and a salt thereof, a hydroxyethyl methacrylate homopolymer and copolymer, a hydroxyethyl acrylate homopolymer and copolymer, a hydroxypropyl methacrylate homopolymer and copolymer, a hydroxypropyl acrylate homopolymer and copolymer, a hydroxybutyl methacrylate homopolymer and copolymer, a hydroxybutyl acrylate homopolymer and copolymer, polyethylene glycol and a derivative thereof, a hydroxypropylene polymer, polyvinyl alcohol and a derivative thereof, hydrolyzed polyvinyl acetate having a degree of hydrolysis of at least 60%, preferably at least 80%, polyvinyl formal, polyvinyl pyrrolidone, an acrylamide homopolymer and copolymer, a methacrylamide homopolymer and copolymer, an N-methylolacrylamide homopolymer and copolymer, a 2-acrylamido-2-methyl-1-propanesulfonic acid homopolymer and copolymer, and a 2-methacryloyloxyethylsulfonic acid homopolymer and copolymer.

The above-mentioned hydrophilic resin may be used after it has been crosslinked to such a degree that an unexposed area can be developed on a printing machine. The crosslinking agents include aldehydes such as glyoxal, a melamine-formaldehyde resin and a urea-formaldehyde resin, methylol compounds such as N-methylolurea, N-methylolmelamine and a methylol-modified polyamide resin, active vinyl compounds such as divinyl sulfone and bis (β-hydroxyethylsulfonic acid), epoxy compounds such as epichlorohydrin, polyethylene glycol diglycidyl ether, a polyamide, a polyamine, an epichlorohydrin addition product and a polyamide-epichlorohydrin resin, ester compounds such as a monochloroacetate and a thioglycolate, polycarboxylic acids such as a polyacrylic acid and a methyl vinyl ether/maleic acid copolymer, inorganic crosslinking agents such as boric acid, titanyl sulfate, a Cu salt, an Al salt, a Sn salt, a V salt and a Cr salt, and modified polyamide polyimide resins.

In addition, a crosslinking catalyst such as ammonium chloride, a silane coupling agent or a titanate coupling agent can be used together.

The image forming layer contains an acid precursor. The acid precursor generates an acid when exposed, thereby initiating or accelerating the reaction of the vinyloxy group-containing compound. It is better from the viewpoint of aging stability that the acid precursor is contained in the hydrophilic resin of the image forming layer.

The acid precursors that can be used in the present invention include a photoinitiator for photocationic polymerization, a photoinitiator for photoradical polymerization, a photoachromatizing agent, a photodiscoloring agent, a well-known acid generator used in a microresist, a well-known compound thermally decomposed to generate an acid, and a mixture thereof. They can be appropriately selected and used.

Examples thereof include diazonium salts described in S. I. Schlesinger, Photogr. Sci. Eng., 18, 387 (1974) and T. S. Bal et al., *Polymer*, 21, 423 (1980), ammonium salts described in U.S. Pat. Nos. 4,069,055, 4,069,056 and Re 27,992, and Japanese Patent Laid-Open No. 365049/1992, phosphonium salts described in D. C. Necker et al., Macromolecules, 17, 2468 (1984), C. S. Wenet et al., Teh. Proc. Conf. Rad. Curing ASIA, p. 478, Tokyo, Oct. (1988), U.S. Pat. Nos. 4,069,055 and 4,069,056, iodonium salts described in J. V. Crivello et al., Macromolecules, 10(6), 1307 (1977), Chem. & Eng. News, p. 31, Nov. 28 (1988), European Patent 104,143, Japanese Patent Laid-Open Nos. 150848/1990 and 296514/1990, sulfonium salts described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), European Patents 370,693, U.S. Pat. Nos. 3,902,114, 233,567, 297,443 and 297,442, U.S. Pat. Nos. 4,933,377, 161,811, 410,201, 339,049, 4,760,013, 4,734,444, 2,833,827, German Patents 2,904,626, 3,604,580 and 3,604,581, selenonium salt described in J. V. Crivello et al., Macromolecules, 10(6), 1307 (1977) and J. V. Crivello et al., J. Polymer Sci., Polymer Chem. Ed., 17, 1047 (1979), onium salts described in C. S. Wen et al., Teh. Proc. Conf. Rad. Curing ASIA, p. 478, Tokyo, Oct. (1988), organic halogen compounds described in U.S. Pat. No. 3,905,815, Japanese Patent Publication No. 4605/1971, Japanese Patent Laid-Open Nos. 36281/1973, 32070/1980, 239736/1985, 169835/1986, 169837/1986, 58241/1987, 212401/1987, 70243/1988 and 298339/1988, organic metals/organic halides described in K. Meier et al., J. Rad. Curing, 13(4), 26 (1986), T. P. Gill et al., Inorg. Chem., 19, 3007 (1980), D. Astruc, Acc. Chem. Res., 19(12), 377 (1896) and Japanese Patent Laid-Open No. 161445/1990, photoacid generating agents having o-nitrobenzyl type protective groups described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24), 2205 (1978), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11(4), 191 (1985), H. M. Houlihan et al., Macromolecules, 21, 2001 (1988), P. M. Collins et al., J. Chem. Soc., Chem. Commun., 532 (1972), Hayase et al., Macromolecules, 18, 1799 (1985), E. Reichmanis et al., J. Electrochem. Soc., Solid State Sci. Technol., 130(6), H. M. Houlihan et al., Macromolecules, 21, 2001 (1988), European Patents 0290,750, 046,083, 156,535, 271,851 and 0,388, 343, U.S. Pat. Nos. 3,901,710 and 4,181,531, Japanese Patent Laid-Open Nos. 198538/1985 and 133022/1978, compounds generating sulfonic acids by photolysis, which are represented by iminosulfonates, described in M. TUNOOKA et al., Polymer Preprints Japan, 38 (8), G. Berner et al., J. Rad. Curing, 13 (4), W. J. Mijs et al., Coating Technol., 55(697), 45 (1983), Akzo, H. Adachi et al., Polymer Preprints Japan, 37 (3), European Patents 0199,672, 84,515, 199,672, 044,115 and 0101,122, U.S. Pat. Nos. 4,618,564, 4,371,605 and 4,431,774, Japanese Patent Laid-Open Nos. 18143/1989 and 245756/1990, and Japanese Patent Application No. 140109/1991, and disulfone compounds described in Japanese Patent Laid-Open No. 166544/1986.

Compounds in which these acid generating groups or compounds are introduced into main chains or side chains of polymers, for example, compounds described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, Japanese Patent Laid-Open Nos.26653/1988, 164824/1980, 69263/1987, 1460387/1988, 163452/1988, 153853/1987 and 146029/1988 can be used.

Further, compounds generating acids by light described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 can also be used. Specific examples thereof include the following compounds:

(A-1)

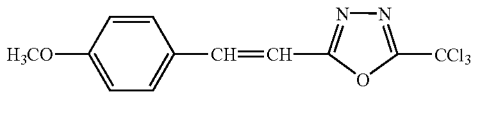

(A-2)

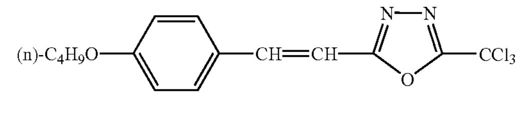

(A-3)

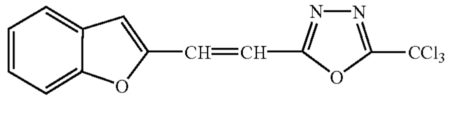

-continued
(A-4
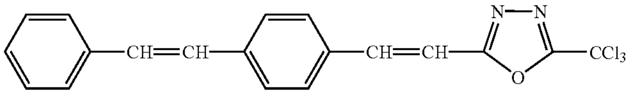
(A-5)
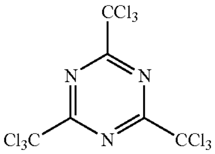
(A-6)
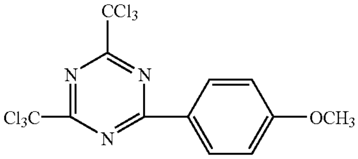
(A-7)
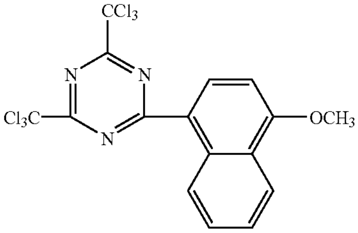
(A-8)
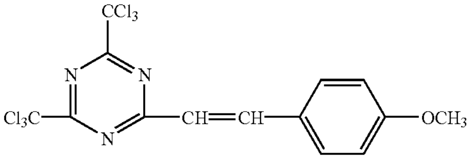
(A-9)
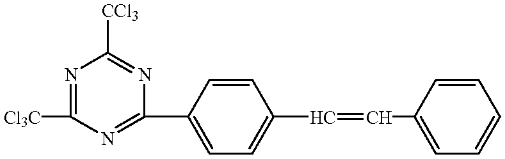
(A-10)
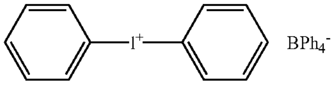
(A-11)
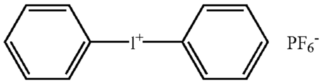
(A-12)
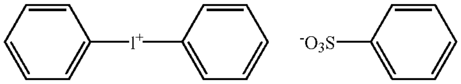
(A-13)
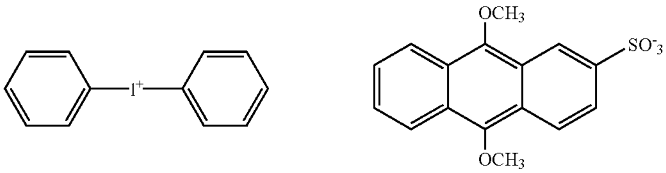

-continued
(A-14)
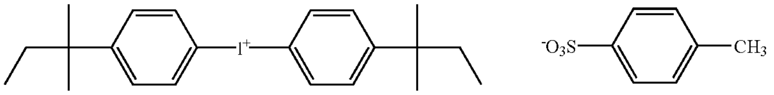
(A-15)
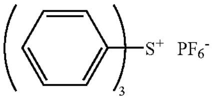
(A-16)
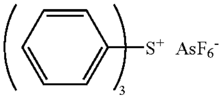
(A-17)
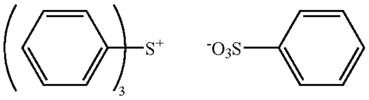
(A-18)
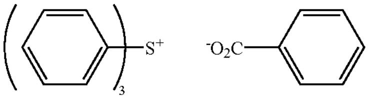
(A-19)
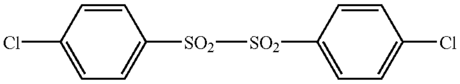
(A-20)
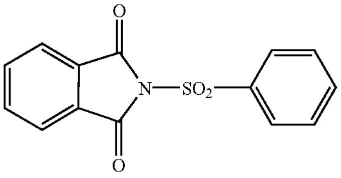
(A-21)
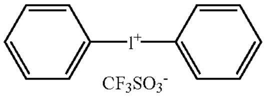
(A-22)
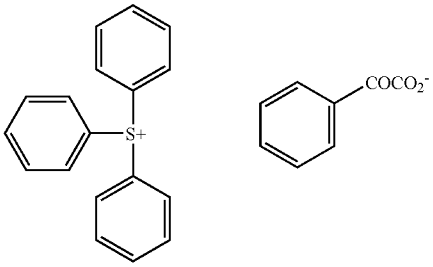
(A-23)
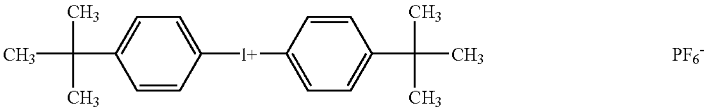
(A-24)
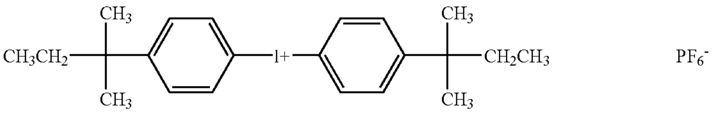
(A-25)
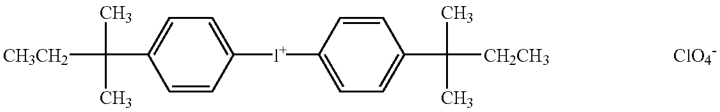

-continued
(A-26)
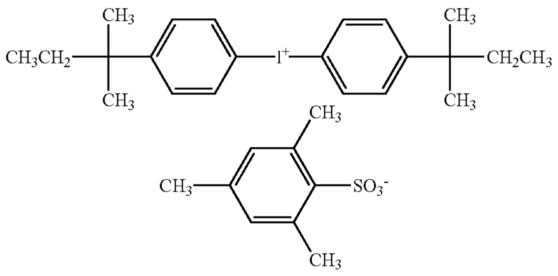
(A-27)
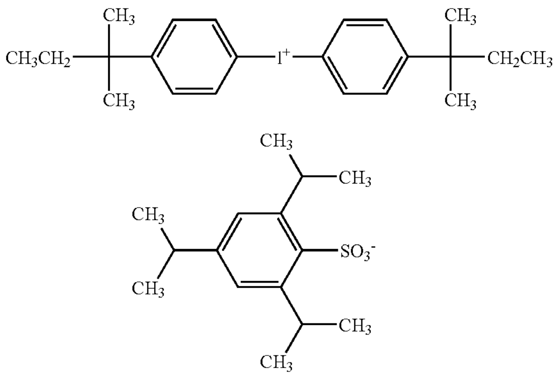
(A-28)
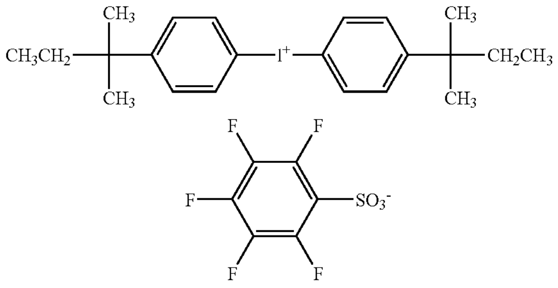
(A-29)
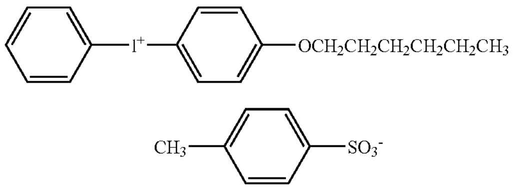
(A-30)
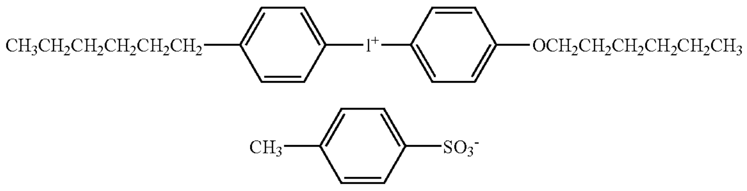
(A-31)
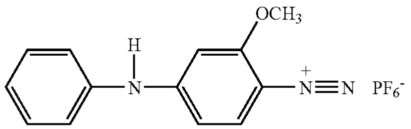

-continued
(A-32)
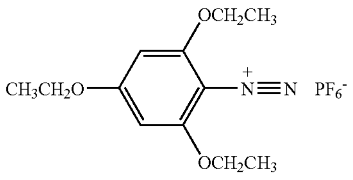
(A-33)
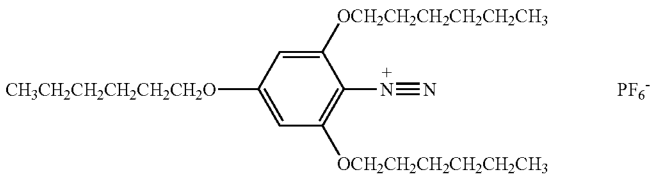
(A-34)
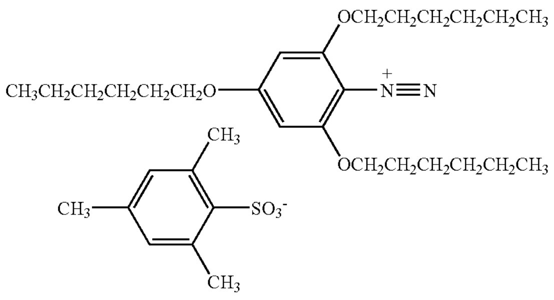
(A-35)
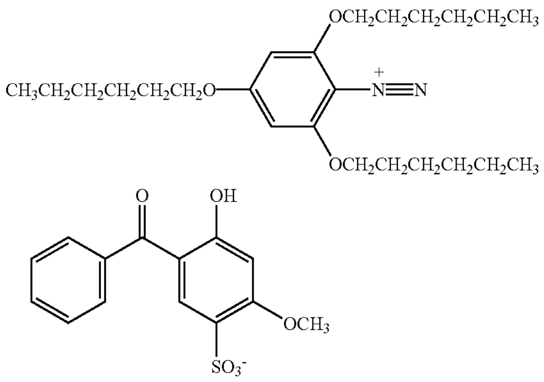
(A-36)
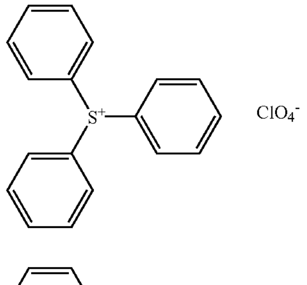
(A-37)
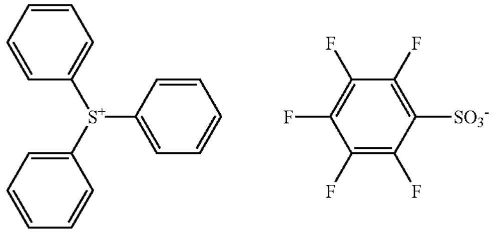

-continued
(A-38)
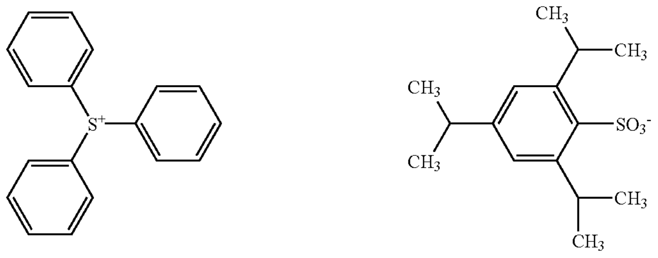
(A-39)
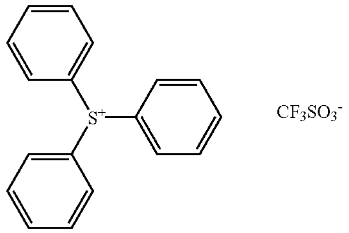
(A-40)
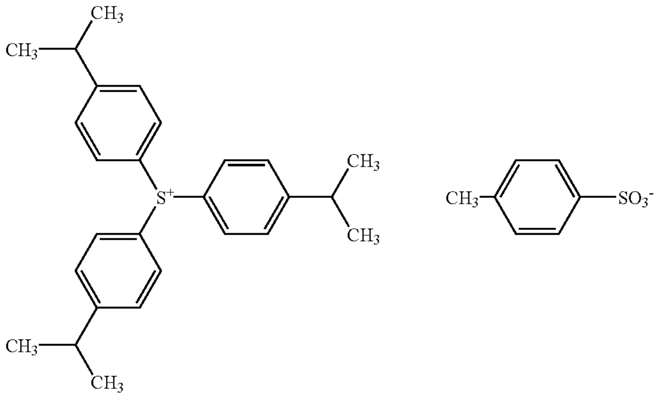
(A-41)
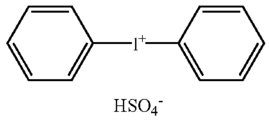
(A-42)
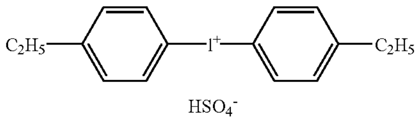
(A-43)
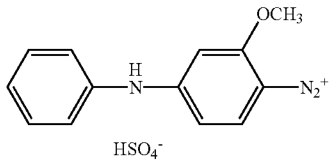
(A-44)
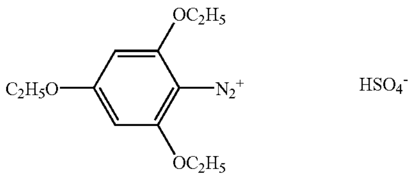

-continued (A-45)

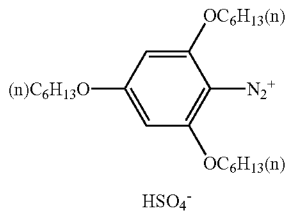

(A-46)

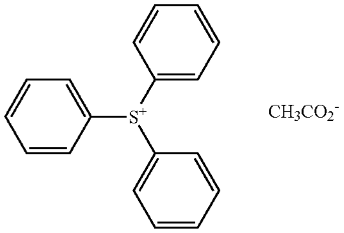

(A-47)

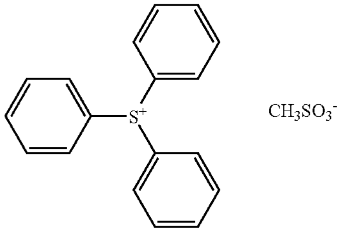

(A-48)

The amount of these acid precursors added is preferably from 0.01% to 20% by weight, and more preferably from 0.1% to 10% by weight, based on the total solid content of the image forming layer.

The image forming layer of the present invention contains a light-to-heat conversion agent for increasing light-to-heat conversion efficiency and enhancing sensitivity. The light-to-heat conversion agent can also be contained in the hydrophilic resin of the image forming layer. However, when the agent is contained in the fine particles or the microcapsules, high sensitivity and high printing durability are easier to be obtained.

Such light-to-heat conversion agents may be any, as long as they are light absorptive materials having an absorption band at least partly within the range of 700 to 1200 nm, and various pigments, dyes and fine metal particles can be used.

As the pigments, there can be utilized commercially available pigments and infrared absorptive pigments described in “Color Index (C. I.) Binran (Handbook)”, “Saishin Ganryo Binran (The Newest Pigment Handbook)” (edited by Nippon Ganryo Gijutsu Kyokai (The Pigment Technology Society of Japan), 1977), “Saishin Ganryo Oyo Gijutsu (The Newest Pigment Applied Technology)” (CMC Shuppan, 1986) and “Insatsu Ink Gijutsu (Printing Ink Technology)” (CMC Shuppan, 1984).

For improving the dispersibility of these pigments in layers to which they are added, they can be surface treated by well-known methods as needed. Conceivable surface treatment methods include a method of coating a pigment surface with a hydrophilic resin or a lipophilic resin, a method of adhering a surfactant to a pigment surface, and a method of bonding a reactive material (for example, silica sol, alumina sol, a silane coupling agent, an epoxy compound or an isocyanate compound) to a pigment surface.

It is desirable that the pigment added to the hydrophilic layer is surface coated with a hydrophilic resin or silica sol so that the pigment is easily dispersed in a water-soluble resin and the hydrophilicity is not impaired. The particle size of the pigment is preferably within the range of 0.01 μm to 1 μm, and more preferably within the range of 0.01 μm to 0.5 μm. As a method for dispersing the pigment, a well-known dispersing technique used for the production of ink or toner can be used.

Particularly preferred examples of the pigments include carbon black.

As the dyes, there can be used commercially available dyes and well-known dyes described in documents (for example, “Senryo Binran (Dye Handbook)” (edited by Yuki Gosei Kagaku Kyokai (Organic Synthetic Chemical Society), 1970); “Kagaku Kogyo (Chemical Industry)”, May, 1986, pages 45 to 51, Near-Infrared Absorptive Dyes; "Development and Market Trend of Functional Dyes of the 1990s", chapter 2, item 2.3 (CMC, 1990); and patents. Specifically, preferred are an azo dye, a metal complex azo dye, a pyrazolone azo dye, an anthraquinone dye, a phthalocyanine dye, a carbonium dye, a quinoneimine dye, a polymethine dye and cyanine dye.

Further, examples thereof include cyanine dyes described in Japanese Patent Laid-Open Nos. 125246/1983, 84356/1984 and 78787/1985, methine dyes described in Japanese Patent Laid-Open Nos. 173696/1983, 181690/1983 and 194595/1983, naphthoquinone dyes described in Japanese Patent Laid-Open Nos. 112793/1983, 224793/1983, 48187/1984, 73996/1984, 52940/1985and 63744/1985, squarylium dyes described in Japanese Patent Laid-Open No. 112792/1983, cyanine dyes described in British Patent 434,875, dyes described in U.S. Pat. No. 4,756,993, cyanine dyes described in U.S. Pat. No. 4,973,572, dyes described in Japanese Patent Laid-Open No. 268512/1998 and phthalocyanine dyes described in Japanese Patent Laid-Open No. 235883/1999.

Further, a near-infrared absorption sensitizer described in U.S. Pat. No. 5,156,938 is also suitably used as the dye. Still further, arylbenzo(thio)pyrylium salts described in U.S. Pat. No. 3,881,924, trimethinethiapyrylium salts described in Japanese Patent Laid-Open No. 142645/1982, pyrylium compounds described in Japanese Patent Laid-Open Nos. 181051/1983, 220143/1983, 41363/1984, 84248/1984, 84249/1984, 146063/1984 and 146061/1984, cyanine dyes described in Japanese Patent Laid-Open No. 216146/1984, pentamethinethiopyrylium salts described in U.S. Pat. No. 4,283,475, pyrylium compounds disclosed in Japanese Patent Publication Nos. 13514/1993 and 19702/1993, and Epolite III-178, Epolite III-130 and Epolite III-125 manufactured by Epoline are also preferably used.

Of these, dyes preferred for addition to a hydrophilic matrix such as the hydrophilic resin of the image forming layer are water-soluble dyes, and specific examples thereof are shown below:

(IR-1)

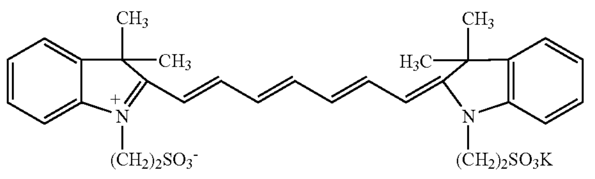

(IR-2)

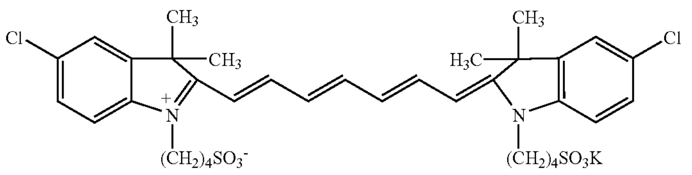

(IR-3)

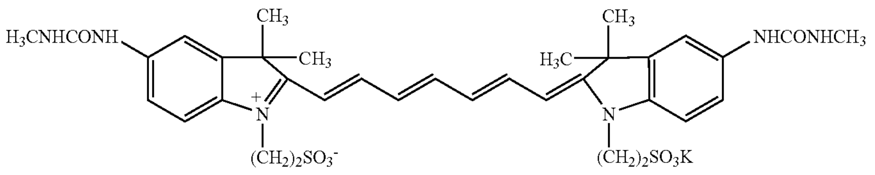

(IR-4)

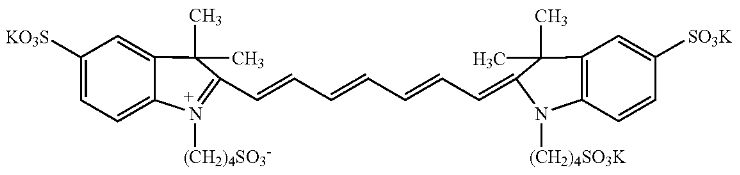

(IR-5)

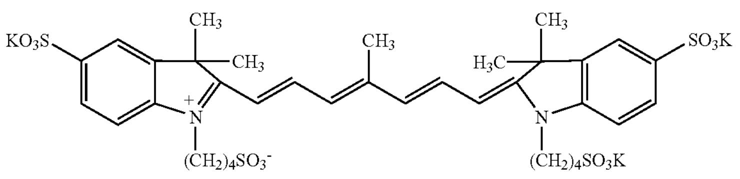

-continued
(IR-6)
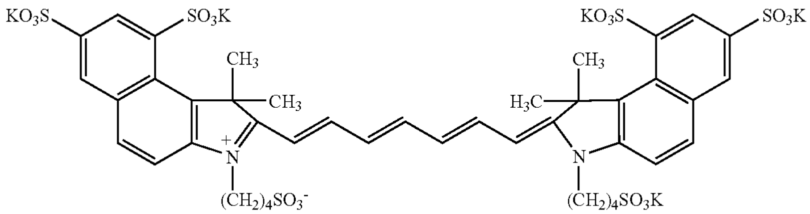
(IR-7)
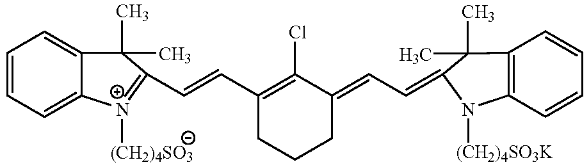
(IR-8)
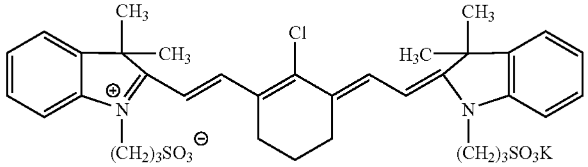
(IR-9)
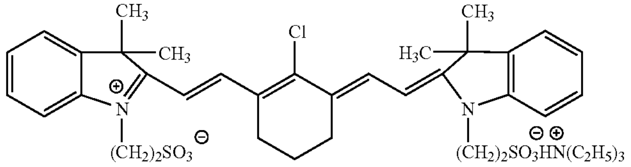
(IR-10)
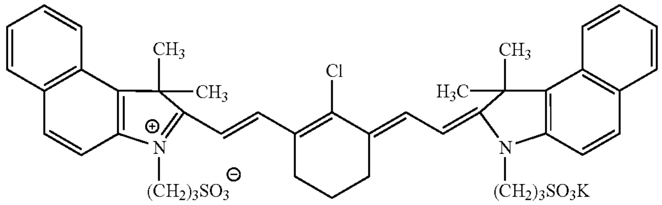
(IR-11)
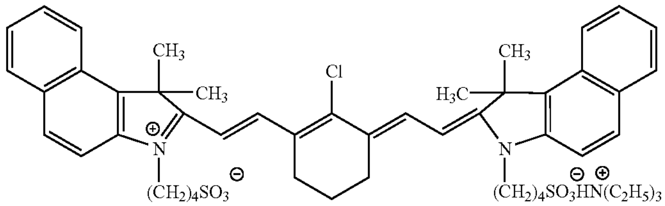
(IR-12)
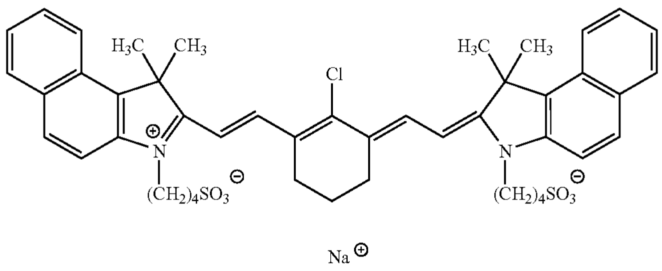
The infrared absorption dyes added to the hydrophobic compounds such as the microcapsules contained in the image forming layer of the present invention may be the above-mentioned infrared absorption dyes, but more preferably lipophilic dyes. Specific examples thereof include the following dyes:

(IR-21)
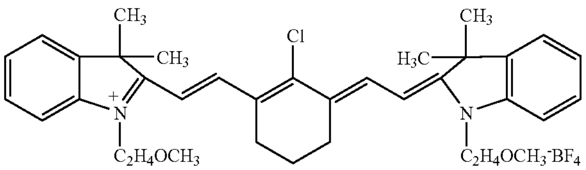
(IR-22)
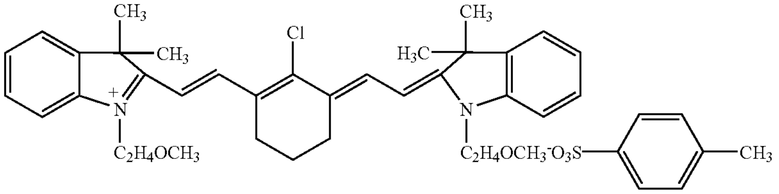
(IR-23)
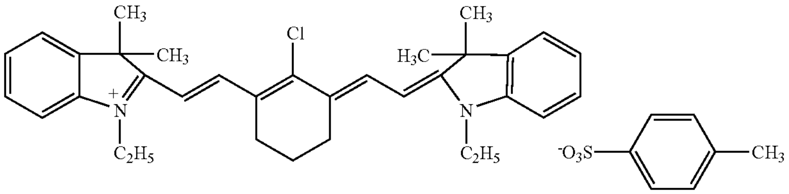
(IR-24)
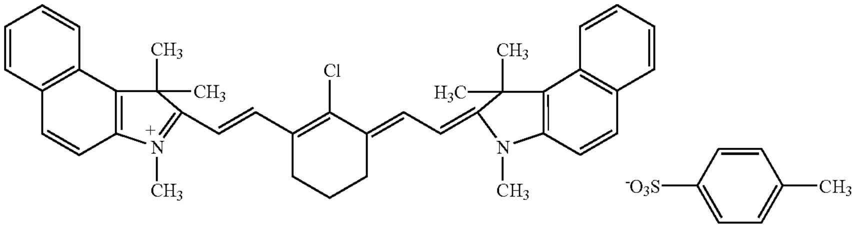
(IR-25)
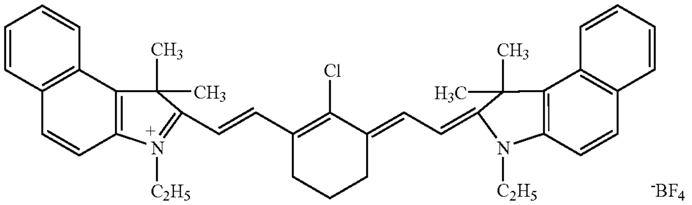
(IR-26)
M=VO, R=i-$C_5H_{11}$
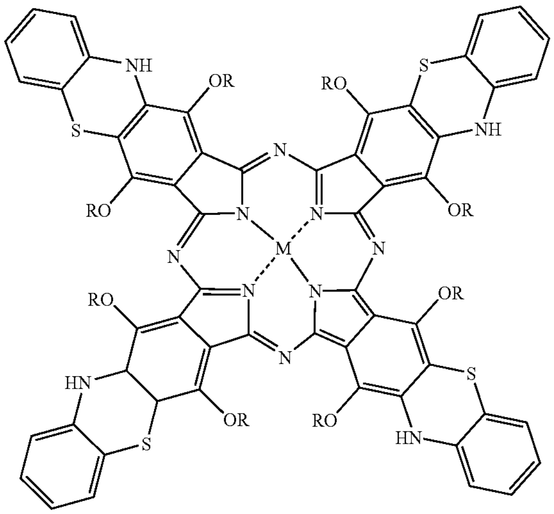

-continued (IR-27)

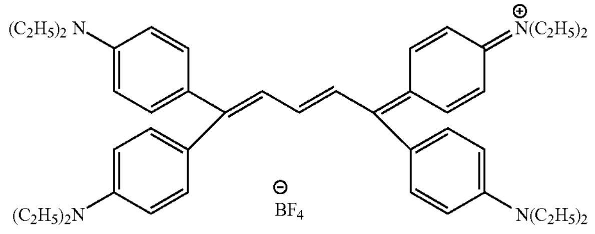

(IR-28)

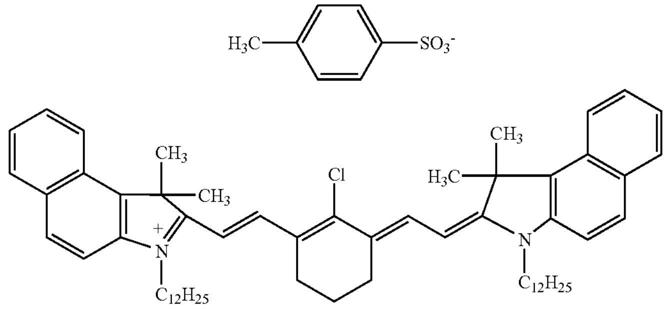

The above-mentioned infrared absorption dye can be added to the image forming layer in an amount of 30% by weight or less. The amount thereof added is preferably from 5% to 25% by weight, and particularly preferably from 6% to 20% by weight. Good sensitivity is obtained within this range.

Fine metal particles can also be used as the infrared absorption dye. Many of the fine metal particles are light-heat convertible and also self exothermic.

Preferred examples of the fine metal particles include fine particles of simple substances, alloys, oxides or sulfides of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re and Sb.

Of these metals constituting the fine metal particles, preferred are metals having a melting point of about 1,000° C. or less to cause easy heat fusion by light irradiation, and having absorption in the infrared, visible or ultraviolet region, such as Re, Sb, Te, Au, Ag, Cu, Ge, Pb and Sn.

Particularly preferred are fine metal particles having a relatively low melting point and a relatively high absorbance to heat radiation, for example, the fine particles of Ag, Au, Cu, Sb, Ge and Pb. Particularly preferred examples of the elements include Ag, Au and Cu.

Further, the fine metal particles may be composed of two or more light-to-heat conversion substances, for example, a mixture of the fine particles of a low-melting metal such as Re, Sb, Te, Au, Ag, Cu, Ge, Pb or Sn and the fine particles of a self exothermic metal such as Ti, Cr, Fe, Co, Ni, W or Ge. It is preferred that fine pieces of a metal such as Ag, Pt or Pd, whose light absorption is particularly high when it is converted to fine pieces, are combined with other fine metal particles.

As for the fine particles of the simple substances and alloys described above, the effect of the present invention is more exhibited by hydrophilization treatment of surfaces thereof. Surface hydrophilization methods which can be used include a method of surface treating the particles with a compound which is hydrophilic and has adsorptivity onto the particles, for example, a surfactant, a method of surface treating the particles with a compound having a hydrophilic group reactable with a constituent material of the particles, and a method of providing the particles with protective colloidal hydrophilic polymer films. Particularly preferred is surface silicate treatment. For example, in the case of fine iron particles, surfaces thereof can be sufficiently hydrophilized by a method of immersing the particles in an aqueous solution of sodium silicate (3 wt %) at 70° C. for 30 seconds. For the other fine metal particles, the surface silicate treatment can also be conducted in a similar manner.

The particle size of these particles is preferably 10 μm or less, more preferably from 0.003 to 5 μm, and particularly preferably from 0.01 to 3 μm. Good sensitivity and resolution are obtained within this range.

When these fine metal particles are used as the infrared absorption dyes in the present invention, the amount thereof added is 10% by weight or more, more preferably 20% by weight or more, and particularly preferably 30% by weight or more, based on the solid content of the image forming layer. Good sensitivity is obtained within this range.

Further, a dye having high absorption in the visible light region can be used as a coloring agent for an image, in order to make it easy to distinguish an image area from a non-image area after image formation.

Specific examples of the dyes include Oil Yellow #101, Oil Yellow #103, Oil Pink #312, Oil Green BG, Oil Blue BOS, Oil Blue #603, Oil Black BY, Oil Black BS, Oil Black T-505 (the above dyes are manufactured by Orient Chemical Industries Co., Ltd.), Victoria Pure Blue, Crystal Violet (CI 42555), Methyl Violet (CI 42535), Ethyl Violet, Rhodamine B (CI 145170B), Malachite Green (CI 42000), Methylene Blue (CI 52015) and dyes described in Japanese Patent Laid-Open No. 293247/1987. Further, pigments such as a phthalocyanine pigment, an azo pigment and titanium oxide can also be suitably used. The amount thereof added is from 0.01% to 10% by weight, based on the total solid content of a coating solution for the image forming layer.

Further, in order to impart flexibility to a coating film, a plasticizer can be added to the image forming layer used in the present invention, as needed. For example, polyethylene glycol, tributyl citrate, diethyl phthalate, dibutyl phthalate, dihexyl phthalate, dioctyl phthalate, tricresyl phosphate, tributyl phosphate, trioctyl phosphate or tetrahydrofurfuryl oleate is used.

The image forming layer used in the present invention is formed by dissolving or dispersing the respective required ingredients described above in a solvent to prepare a coating solution, and applying the resulting solution. The solvents used herein include but are not limited to ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea. N-methylpyrrolidone, dimethyl sulfoxide, sulfolane, γ-butyrolactone, toluene and water. Theses solvents are used either alone or as a mixture thereof. The solid content of the coating solution is preferably from 1% to 50% by weight.

Further, the amount coated (solid content) of the image forming layer obtained on a support after coating and drying is generally preferably from 0.5 to 5.0 g/$m^2$, although it varies depending on its use. As coating methods, various methods can be used. Examples thereof include bar coater coating, rotation coating, spray coating, curtain coating, dip coating, air knife coating, blade coating and roll coating.

A surfactant for improving coating properties, for example, a fluorine surfactant as described in Japanese Patent Laid-Open No. 170950/1987, can be added to the coating solution for the image forming layer according to the present invention. The amount thereof added is preferably from 0.01% to 1% by weight, and more preferably from 0.05% to 0.5% by weight, based on the total solid content of the image forming layer.

[Overcoat Layers]

In the lithographic printing plate precursor of the present invention, a water-soluble overcoat layer can be provided on the image forming layer in order to prevent a surface of the image forming layer from being stained with a lipophilic substance. The water-soluble overcoat layer used in the present invention is easily removable in printing, and contains a resin selected from water-soluble organic high-molecular compounds. The water-soluble organic high-molecular compounds used herein are ones in which coating films formed by coating and drying have film-forming ability, and specific examples thereof include polyvinyl acetate (having a hydrolysis rate of 65% or more), polyacrylic acid, an alkali metal salt or an amine salt thereof, a polyacrylic acid copolymer, an alkali metal salt or an amine salt thereof, polymethacrylic acid, an alkali metal salt or an amine salt thereof, a polymethacrylic acid copolymer, an alkali metal salt or an amine salt thereof, polyacrylamide, a copolymer thereof, polyhydroxyethyl acrylate, polyvinyl pyrrolidone, a copolymer thereof, polyvinyl methyl ether, a vinyl methyl ether/maleic anhydride copolymer, a poly-2-acryl-amido-2-methyl-1-propanesulfonic acid copolymer, an alkali metal salt or an amine salt thereof, gum arabic, a cellulose derivative (for example, carboxymethyl cellulose, carboxyethyl cellulose or methyl cellulose), a modified product thereof, white dextrin, Pullulan and enzymolysis-etherified dextrin. These resins can also be used as a mixture of two or more of them, depending on their purpose.

Further, as the polymer used in the water-soluble overcoat layer, the polarity-converted polymer is particularly preferred in terms of increased resistance to a fountain solution of an image area and improved printing durability.

The above-mentioned water-soluble infrared absorption dye may be added to the overcoat layer. Further, in the case of coating of an aqueous solution, a nonionic surfactant such as polyoxyethylene nonyl phenyl ether or polyoxyethylene dodecyl ether can be added to the overcoat layer for the purpose of ensuring uniformity of coating.

The dry amount of the overcoat layer coated is preferably from 0.1 to 2.0 g/$m^2$. Within this range, the surface of the image forming layer can be sufficiently prevented from being stained with a lipophilic substance such as fingerprints, without impairment of on-machine development quality.

[Supports]

In the lithographic printing plate precursors of the present invention, the supports on which the above-mentioned image forming layers can be formed are dimensionally stable tabular materials, which include, for example, paper, paper laminated with a plastic (for example, polyethylene, polypropylene or polystyrene), a metal plate (for example, an aluminum, zinc or copper plate), a plastic film (for example, a cellulose diacetate, cellulose triacetate, cellulose propionate, cellulose butyrate, cellulose acetate butylate, cellulose nitrate, polyethylene terephthalate, polyethylene, polystyrene, polypropylene, polycarbonate or polyvinyl acetal film) and paper or a plastic film laminated or vapor deposited with the metal as described above. Preferred examples of the supports include a polyester film and an aluminum plate.

The aluminum plate is a pure aluminum plate, an alloy plate mainly composed of aluminum and containing foreign elements in slight amounts, or an aluminum or aluminum alloy film laminated with a plastic. Examples of the foreign elements contained in the aluminum alloy include silicon, iron, manganese, copper, magnesium, chromium, zinc, bismuth, nickel and titanium. The content of the foreign elements in the alloy is at most 10% by weight or less. The aluminum plate may be an aluminum plate obtained from an ingot by DC casting method or an aluminum plate obtained from an ingot by continuous casting method. However, as the aluminum plates applicable to the present invention, aluminum plates of conventional raw materials well known in the art can be appropriately utilized.

The thickness of the above-mentioned substrate used in the present invention is from 0.05 mm to 0.6 mm, preferably from 0.1 mm to 0.4 mm, and particularly preferably from 0.15 mm to 0.3 mm.

Prior to use of the aluminum plate, surface treatment such as surface roughening or anodic oxidation is preferably conducted. The surface treatment makes it easy to improve hydrophilicity and to ensure adhesion to the image forming layer.

The surface roughening treatment of the aluminum plate is carried out by various methods, for example, a method of mechanically roughening the surface, a method of electrochemically roughening the surface by dissolution and a method of chemically selectively dissolving the surface. As the mechanical method, a well-known method such as ball polishing, brushing, blasting or buffing can be used. As the chemical method, a method of immersing the plate in a saturated aqueous solution of an aluminum salt of a mineral acid as described in Japanese Patent Laid-Open No. 31187/1979 are suitable. Further, as the electrochemical surface roughening method, there is a method of roughening the surface in an electrolytic solution containing hydrochloric acid or nitric acid with alternating current or direct current. Furthermore, an electrolytic surface roughening method using a mixed acid as described in Japanese Patent Laid-Open No. 63902/1979 can also be utilized.

The surface roughening by the methods as described above is preferably conducted within such a range that the center line surface roughness (Ra) (defined to JIS B 0601) of the surface of the aluminum plate becomes 0.2 to 1.0 μm.

The aluminum plate thus roughened is subjected to alkali etching treatment using an aqueous solution of potassium hydroxide or sodium hydroxide as needed, and further subjected to neutralizing treatment, followed by anodic oxidization for enhancing wear resistance as desired.

As electrolytes used in anodic oxidization of the aluminum plate, various electrolytes for forming porous oxide films can be used. In general, sulfuric acid, hydrochloric acid, oxalic acid, chromic acid and mixed acids thereof are used. The concentration of the electrolyte can be appropriately determined depending on the kind of electrolyte.

The conditions of anodic oxidation can not be specified without reservation, because they vary depending on the kind of electrolyte. However, an electrolyte concentration within the range of 1% to 80% by weight, a solution temperature within the range of 5° C. to 70° C., a current density within the range of 5 to 60 $A/dm^2$, a voltage within the range of 1 to 100 V and an electrolytic time within the range of 10 seconds to 5 minutes are generally proper.

The amount of the oxide film formed is preferably from 1.0 to 5.0 $g/m^2$, and particularly preferably from 1.5 to 4.0 $g/m^2$.

As the support used in the present invention, the substrate that is surface treated as described above and has the anodic oxide film may be used as such. However, for more improving adhesion to the upper layer, hydrophilicity, stain resistance and heat insulation properties, treatment for enlarging micropores of the anodic oxide film, treatment for closing micropores and surface hydrophilization treatment by immersion in a hydrophilic compound-containing aqueous solution, which are described in Japanese Patent (Application) Laid-Open Nos. 253181/2001 and 322365/2001, can be appropriately selectively conducted.

Suitable examples of the hydrophilic compounds for the above-mentioned hydrophilization treatment include polyvinyl-phosphonic acid, a sulfonic acid group-containing compound, a saccharide compound, citric acid, an alkali metal silicate, potassium zirconium fluoride and a phosphate/inorganic fluorine compound.

When a support insufficient in surface hydrophilicity such as a polyester film is used as the support of the present invention, it is desirable to make the surface hydrophilic by application of a hydrophilic layer. The hydrophilic layer is preferably a hydrophilic layer formed by applying a coating solution containing a colloid of an oxide or hydroxide of at least one element selected from beryllium, magnesium, aluminum, silicon, titanium, boron, germanium, tin, zirconium, iron, vanadium, antimony and a transition metal, as described in Japanese Patent Laid-Open No. 199175/2000.

In the present invention, an inorganic undercoat layer of, for example, a water-soluble metal salt such as zinc borate, or an organic undercoat layer containing, for example, carboxymethyl cellulose, dextrin or polyacrylic acid, as described in Japanese Patent Laid-Open No. 322365/2000, may be provided before coating of the image forming layer.

[Plate-making and Printing]

In the lithographic printing plate precursor of the present invention, image formation is performed by heat. Specifically, direct imagewise recording with a thermal recording head, scanning exposure with an infrared laser, high illuminance flush exposure with a xenon discharge lamp, or infrared lamp exposure is used. However, exposure with a high-output solid infrared laser such as a semiconductor laser or a YAG laser, which radiates an infrared ray having a wavelength of 700 to 1200 nm, is suitable.

The lithographic printing plate precursor of the present invention can be irradiated with a laser having a laser output of 0.1 to 300 W. When a pulse laser is used, a laser having a peak output of 1000 W, preferably 2000 W is preferably used for irradiation. With respect to the exposure amount in this case, the a real exposure intensity before modulation with an image for printing is preferably within the range of 0.1 to 10 $J/cm^2$, and more preferably within the range of 0.3 to 1 $J/cm^2$.

The image-exposed lithographic printing plate precursor of the present invention can be mounted on a printing machine without further treatment, and printed using ink and a fountain solution through an ordinary procedure.

It is also possible to mount such a lithographic printing plate precursor on a cylinder of a printing machine, and then, to expose it with a laser carried by a printing machine, followed by on-machine development, supplying a fountain solution and/or ink, as described in Japanese Patent 2938398.

Further, after such a lithographic printing plate precursor is developed using water and/or an appropriate aqueous solution as a developing solution, it can also be used for printing.

EXAMPLES

The present invention will be illustrated in detail with reference to the following examples, which are, however, not to be construed as limiting the present invention.

Example I

Production Example of Support

A forging of a JIS A1050 alloy containing 99.5% or more aluminum, 0.30% of Fe, 0.10% of Si, 0.02% of Ti and 0.013% of Cu was subjected to cleaning treatment, and cast. In the cleaning treatment, the forging was subjected to degassing treatment in order to remove unnecessary gas such as hydrogen in the forging, and treated through a ceramic tube filter. Casting method was carried out by DC casting method. A solidified ingot having a plate thickness of 500 mm was scalped by 10 mm from a surface thereof, and homogenization treatment was conducted at 550° C. for 10 hours so that intermetallic compounds were not coarsened. Then, hot rolling was conducted at 400° C., and intermediate annealing was conducted in a continuous annealing furnace at 500° C. for 60 seconds, followed by cold rolling to form a rolled aluminum plate having a thickness of 0.30 mm. The center line average surface roughness Ra of the plate after cold rolling was adjusted to 0.2 μm by controlling the roughness of pressure rolls. Then, the resulting plate was subjected to a tension leveler in order to improve planarity.

Then, surface treatment was conducted for obtaining a support of the lithographic printing plate.

First, in order to remove rolling oil on a surface of the aluminum plate, degreasing treatment was conducted with a 10 wt % aqueous solution of sodium aluminate at 50° C. for 30 seconds, and neutralization was performed with a 30 wt % aqueous solution of sulfuric acid at 50° C. for 30 seconds, thereby removing smuts.

Then, in order to improve adhesion between the support and the image forming layer, and to give water retention to a non-image area, so-called graining treatment was conducted for roughening the surface of the support. An anode side electrical quantity of 240 C/dm$^2$ was given with an indirect feeder cell at a current density of 20 A/dm$^2$ and an alternating wave form having a duty ratio of 1:1, while keeping an aqueous solution containing 1% by weight of nitric acid and 0.5% by weight of aluminum nitrate at 45° C. and floating an aluminum web in an aqueous solution, thereby conducting electrolytic graining. Then, etching treatment was conducted with a 10 wt % aqueous solution of sodium aluminate at 50° C. for 30 seconds, and neutralization was performed with a 30 wt % aqueous solution of sulfuric acid at 50° C. for 30 seconds, thereby removing smuts.

Further, in order to improve wear resistance, chemical resistance and water retention, an oxide film was formed on the support by anodic oxidation. An 20 wt % aqueous solution of sulfuric acid was used at 35° C. as an electrolyte, and electrolytic treatment was conducted at a direct current of 14 A/dm$^2$ with an indirect feeder cell, while conveying an aluminum web in an electrolyte, thereby forming an anodic oxide film of 2.5 g/m$^2$.

Then, in order to ensure hydrophilicity as a non-image area of the printing plate, silicate treatment was conducted. In the silicate treatment, a 1.5 wt % aqueous solution of sodium tetrasilicate was maintained at 70° C., and the aluminum web was conveyed therein so as to give a contact time of the web of 15 seconds, followed by further washing. The deposit of Si was 10 mg/$^2$. The center line surface roughness Ra (defined in JIS B 0601) of support (1) prepared as described above was 0.25 μm.

Synthesis Examples of Fine Polymer Particles (1) to (3)

As an oil phase ingredient, 6.5 g of polymer P-13 (weight average molecular weight: 45,000) described in this specification, 1.5 g of an infrared absorption dye (IR-28 described in this specification) and 0.1 g of Pionin A-41C (manufactured by Takemoto Oil & Fat Co., Ltd.) were dissolved in 18.0 g of ethyl acetate to prepare a solution, and the resulting solution was mixed with 36.0 g of a 4 wt % aqueous solution of polyvinyl alcohol (PVA 205, manufactured by Kuraray Co., Ltd.), an aqueous phase ingredient. The resulting mixture was subjected to emulsification dispersion with a homogenizer at 12,000 rpm for 10 minutes. Then, 24 g of water was added, and ethyl acetate was evaporated with stirring at 40° C. for 3 hours. The solid concentration of the resulting dispersion of fine polymer particles was 12.0% by weight, and the average particle size thereof was 0.25 μm.

Dispersions of fine polymer particles (2) and (3) were each prepared in the same manner as described above with the exception that P-15 and P-16 described in this specification were each used.

Synthesis Example of Fine Polymer Particles (4):

As an oil phase ingredient, 3.5 g of a bifunctional vinyloxy compound (M-11 described in this specification), 3.0 g of poly-p-hydroxystyrene (weight average molecular weight: 23,000), 1.5 g of an infrared absorption dye (IR-28 described in this specification) and 0.1 g of Pionin A-41C were dissolved in 18.0 g of ethyl acetate to prepare a solution, and the resulting solution was mixed with 36.0 g of a 4 wt % aqueous solution of PVA 205, an aqueous phase ingredient. The resulting mixture was subjected to emulsification dispersion with a homogenizer at 12,000 rpm for 10 minutes. Then, 24 g of water was added, and ethyl acetate was evaporated with stirring at 40° C. for 3 hours. The solid concentration of the resulting dispersion of fine polymer particles was 11.5% by weight, and the average particle size thereof was 0.26 μm.

Synthesis Example of Microcapsules (1):

As an oil phase ingredient, 100 g of an adduct of trimethylolpropane and xylylene diisocyanate (Takenate D-11ON, manufactured by Takeda Chemical Industries, Ltd., a wall material for microcapsules), 58.8 g of a bifunctional vinyloxy compound (M-11 described in this specification) and 1.2 g of Pionin A-41C were dissolved in 162.5 g of ethyl acetate to prepare a solution. As an aqueous phase ingredient, 375 g of a 4 wt % aqueous solution of PVA 205 was prepared. The oil phase ingredient and the aqueous phase ingredient were emulsified with a homogenizer at 12,000 rpm for 10 minutes. Then, 240 g of water was added, followed by stirring at room temperature for 30 minutes, and further at 40° C. for 3 hours. The solid concentration of the dispersion of microcapsule (1) thus obtained was 22.5% by weight, and the average particle size thereof was 0.41 μm.

Synthesis Examples of Microcapsules (2) to (6), (11) and (12):

As an oil phase ingredient, 100 g of Takenate D-110N, 40.8 g of a bifunctional vinyloxy compound (M-11 described in this specification), 18.0 g of an infrared absorption dye (IR-28 described in this specification) and 1.2 g of Pionin A-41C were dissolved in 162.5 g of ethyl acetate to prepare a solution. As an aqueous phase ingredient, 375 g of a 4 wt % aqueous solution of PVA205 was prepared. The oil phase ingredient and the aqueous phase ingredient were emulsified with a homogenizer at 12,000 rpm for 10 minutes. Then, 240 g of water was added, followed by stirring at room temperature for 30 minutes, and further at 40° C. for 3 hours. The solid concentration of the dispersion of microcapsules (2) thus obtained was 21.0% by weight, and the average particle size thereof was 0.35 μm. Microcapsules (3) to (5), (11) and (12) were each synthesized by using M-8, M-24, M-32, and M-57 and M-58 described below, respectively, instead of M-11. Further, microcapsules (6) were synthesized by using M-40 instead of M-11, and IR-24 instead of IR-28.

(M-57)

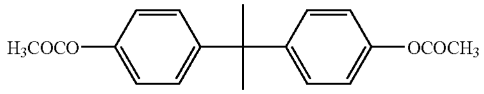

(M-58)

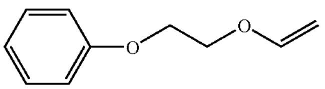

Synthesis Example of Microcapsules (7):

As an oil phase ingredient, 10 g of Takenate D-110N, 5.88 g of a vinyloxy group-containing polymer (P-11 described in this specification, weight average molecular weight: 23,000) and 0.12 g of Pionin A-41C were dissolved in 16.25 g of ethyl acetate to prepare a solution. As an aqueous phase ingredient, 37.5 g of a 4 wt % aqueous solution of PVA 205 was prepared. The oil phase ingredient and the aqueous phase ingredient were emulsified with a homogenizer at 12,000 rpm for 10 minutes. Then, 24 g of water was added, followed by stirring at room temperature for 30 minutes, and further at 40° C. for 3 hours. The solid concentration of the dispersion of microcapsules (7) thus obtained was 21.8% by weight, and the average particle size thereof was 0.32 μm.

Synthesis Examples of Microcapsules (8) and (10):

As an oil phase ingredient, 10 g of Takenate D-110N, 4.08 g of a vinyloxy group-containing polymer (P-11 described in this specification, weight average molecular weight: 51,000), 1.8 g of an infrared absorption dye (IR-28 described in this specification) and 0.12 g of Pionin A-41C were dissolved in 16.25 g of ethyl acetate to prepare a solution. As an aqueous phase ingredient, 37.5 g of a 4 wt % aqueous solution of PVA 205 was prepared. The oil phase ingredient and the aqueous phase ingredient were emulsified with a homogenizer at 12,000 rpm for 10 minutes. Then, 24 g of water was added, followed by stirring at room temperature for 30 minutes, and further at 40° C. for 3 hours. The solid concentration of the dispersion of microcapsules (8) thus obtained was 21% by weight, and the average particle size thereof was 0.35 μm. Microcapsules (10) were synthesized by using P-14 instead of P-11.

Synthesis Example of Microcapsules (9):

As an oil phase ingredient, 10 g of Takenate D-110N, 4.08 g of a bifunctional vinyloxy compound (M-11 described in this specification), 10 g of a vinyloxy group-containing polymer (P-11 described in this specification, weight average molecular weight: 51,000), 1.8 g of an infrared absorption dye (IR-28 described in this specification) and 0.12 g of Pionin A-41C were dissolved in 16.25 g of ethyl acetate to prepare a solution. As an aqueous phase ingredient, 37.5 g of a 4 wt % aqueous solution of PVA205 was prepared. The oil phase ingredient and the aqueous phase ingredient were emulsified with a homogenizer at 12,000 rpm for 10 minutes. Then, 24 g of water was added, followed by stirring at room temperature for 30 minutes, and further at 40° C. for 3 hours. The solid concentration of the dispersion of microcapsules (9) thus obtained was 23.2% by weight, and the average particle size thereof was 0.42 μm.

Synthesis Example of Microcapsule (13):

As an oil phase ingredient, 100 g of Takenate D-110N, 40.8 g of a bifunctional vinyloxy compound (M-11 in the specification of the present invention), 18.0 g of an infrared ray-absorbing dye (IR-28 in the specification of the present invention), 11.0 g of an acid precursor (A-14 in the specification of the present invention), and 1.2 g of Pionin A41C were dissolved in 162.5 g of ethyl acetate to prepare a solution. As an aqueous phase ingredient, 375 g of a 4% aqueous solution of PVA205 was prepared. The oil phase ingredient and the aqueous phase ingredient were emulsified with a homogenizer at 12,000 rpm for 10 minutes. Then, 240 g of water was added, followed by stirring at room temperature for 30 minutes, and further at 40° C. for 3 hours. The solid concentration of the dispersion of microcapsule (13) thus obtained was 20.5% by weight, and the average particle size thereof was 0.33 μm.

Examples I-1 to I-15 and Comparative Examples I-1 to I-3:

Coating solutions (1) to (4) for image forming layers having the following compositions containing fine particle ingredients selected from polymer particles (1) to (4) and microcapsules (1) to (12) obtained in the synthesis examples were prepared in combinations shown in Table 1. Then, each of the resulting coating solutions was applied by bar coating onto the support obtained in the above-mentioned production example, and dried in an oven at 80° C. for 90 seconds to prepare a lithographic printing prate precursor in which an image forming layer was formed in a dry amount coated of 1.0 $g/m^2$.

Coating Solution (1) for Image forming layer (Containing Infrared Absorption Dye in Matrix of Image forming layer), Examples I-1 and I-7:

| | |
|---|---|
| Water | 100 g |
| Fine polymer particles or microcapsules (in terms of solid content) | 6.0 g |
| Infrared absorption dye (IR-12 described in this specification) | 0.7 g |
| Acid precursor (A-21 described in this specification) | 0.4 g |

Coating Solution (2) for Image forming layer, Examples I-2 to I-5, I-8, I-9, I-12 and I-13, and Comparative Examples I-1 to I-3:

| | |
|---|---|
| Water | 100 g |
| Fine polymer particles or microcapsules (in terms of solid content) | 6.7 g |
| Acid precursor (A-21 described in this specification) | 0.4 g |

Coating Solution (3) for Image forming layer, Examples I-10, I-11, I-14 and I-15:

| | |
|---|---|
| Water | 100 g |
| Fine polymer particles (in terms of solid content) | 0.7 g |
| Microcapsules (in terms of solid content) | 6.0 g |
| Acid precursor (A-21 described in this specification) | 0.4 g |

Coating Solution (4) for Image forming layer, Example I-6:

| | |
|---|---|
| Water | 100 g |
| Microcapsules (in terms of solid content) | 6.0 g |
| Acid precursor (A-22 described in this specification) | 0.4 g |
| Hydrophilic resin (described in Table 1) | 0.7 g |

Coating Solution (5) for Image-Forming Layer (not containing an acid precursor in the image-forming matrix) Comparative Example I-4:

| | |
|---|---|
| Water | 100 g |
| Microcapsules (in terms of solid content) | 7.1 g |

The lithographic printing plate precursors obtained in Examples I-1 to I-5 and Comparative Examples I-1 and I-2 were each exposed with a Trend setter (3244 VFS, manufactured by Creo) equipped with a water-cooling type 40-W infrared semiconductor laser under the following conditions, that is, at an output of 9 W, at an outer drum revolution of 210 rpm, at a plate face energy of 100 $mJ/m^2$ and at a resolution of 2,400 dpi, and then, mounted on a printing machine (SOR-M, manufactured by Heidelberg) without development processing. After a fountain solution was supplied, ink was supplied, and paper was further supplied to do printing.

In Comparative Example I-3, printing was done in the same manner as with Examples I-1 to I-15 with the exception that the precursor was exposed with the Trend setter (3244 VFS) under the following conditions, that is, at an output of 9 W, at an outer drum revolution of 105 rpm, at a plate face energy of 200 $mJ/m^2$ and at a resolution of 2,400 dpi.

As a result, for the printing plate precursors of all examples, the on-machine development was possible without problems, and printable. The insolubilization rate (unit: % by weight) of an image area at the time when each printing plate precursor was immersed and eluted in MEK for 10 minutes, and the number of printable sheets were shown in Table 1. The higher insolubilization rate results in higher crosslinking density to cause higher printing durability.

Further, for evaluating the stability (i.e., the aging stability) with the lapse of time, after the printing plate precursors had been forcedly aged at 60° C. for three days, printing was performed on machine by supplying a fountain solution and ink in the same manner as above, and the number of sheets of the printing paper lost (the number of the sheets by on-press development) until a good printed matter could be obtained was counted. The more excellent the aging stability of the printing plate precursor, the fewer is the number of the lost sheets.

As shown in the above results, it is clear that the lithographic printing plate precursors using microcapsules encapsulating a compound having two or more vinyloxy groups or fine particles containing a compound having two or more vinyloxy groups have high insolubilization rate to solvent and high printing durability.

Further, in Comparative Example I-3, even when the exposure energy was elevated, the number of printable sheets was small. From the above results, it is clear that the lithographic printing plate precursors of the present invention have high sensitivity.

Further, from Comparative Example I-4, it is clear that the aging stability is excellent in the lithographic printing plate precursors according to the present invention wherein the acid precursor is not contained in microcapsules but contained in the hydrophilic resin in the image-forming layer.

Example II

Production Example of Support:

A forging of a JIS A1050 alloy containing 99.5% or more aluminum, 0.30% of Fe, 0.10% of Si, 0.02% of Ti and 0.013% of Cu was subjected to cleaning treatment, and cast. In the cleaning treatment, the forging was subjected to degassing treatment in order to remove unnecessary gas

TABLE 1

| Example No. | Microcapsules | Fine Resin Particles | IR Dye | Acid Precursor | Hydrophilic Resin | Insolubilization Rate (%) | Number of Printable Sheets | Number of Sheets by On-Press Development after Forced Aging |
|---|---|---|---|---|---|---|---|---|
| I-1 | M-11 (1) | — | IR12 | A-21 | PVA | 56 | 15,000 | 10 |
| I-2 | M-11 + IR28 (2) | — | — | A-21 | PVA | 71 | 15,000 | 12 |
| I-3 | M-8 + IR28 (3) | — | — | A-21 | PVA | 72 | 20,000 | 10 |
| I-4 | M-24 + IR28 (4) | — | — | A-21 | PVA | 74 | 15,000 | 10 |
| I-5 | M-32 + IR28 (5) | — | — | A-21 | PVA | 76 | 20,000 | 10 |
| I-6 | M-40 + IR24 (6) | — | — | A-22 | PAA | 64 | 20,000 | 10 |
| I-7 | P-11 (7) | — | IR12 | A-21 | PVA | 64 | 15,000 | 12 |
| I-8 | P-11 + IR28 (8) | — | — | A-21 | PVA | 61 | 15,000 | 10 |
| I-9 | M-11 + P-11 + IR28 (9) | — | — | A-21 | PVA | 66 | 15,000 | 10 |
| I-10 | M-11 + IR28 (2) | P-13 + IR28 (1) | — | A-21 | PVA | 70 | 20,000 | 12 |
| I-11 | P-14 + IR28 (10) | P-15 + IR28 (2) | — | A-21 | PVA | 58 | 25,000 | 12 |
| I-12 | — | P-16 + IR28 (3) | — | A-21 | PVA | 52 | 20,000 | 12 |
| I-13 | — | M-11 + Polystyrene + IR28 (4) | — | A-21 | PVA | 60 | 20,000 | 10 |
| I-14 | M-11 + IR28 (2) | M-11 + Polystyrene + IR28 (4) | — | A-21 | PVA | 72 | 25,000 | 10 |
| I-15 | P-11 + IR28 (8) | M-11 + Polystyrene + IR28 (4) | — | A-21 | PVA | 70 | 30,000 | 12 |
| Comparative Example I-1 | M-57 + IR28 (11) | — | — | A-21 | PVA | 28 | 500 | 12 |
| Comparative Example I-2 | Monofunctional vinyloxy compound M-58 + IR28 (12) | — | — | A-21 | PVA | 32 | 5,000 | 12 |
| Comparative Example I-3 | M-57 + IR28 (11) | — | — | A-21 | PVA | 39 | 5,000 | 10 |
| Comparative Example I-4 | M-11 + IR28 + A14 (13) | — | — | — | PVA | 50 | — | 15,000 |

In Table 1, PVA indicates PVA 205 used as the dispersing agent for the microcapsules or the fine particles, and PAA indicates polyacrylic acid (weight average molecular weight: 25,000).

such as hydrogen in the forging, and treated through a ceramic tube filter. Casting method was carried out by DC casting method. A solidified ingot having a plate thickness of 500 mm was scalped by 10 mm from a surface thereof, and homogenization treatment was conducted at 550° C. for 10 hours so that intermetallic compounds were not coarsened.

Then, hot rolling was conducted at 400° C., and intermediate annealing was conducted in a continuous annealing furnace at 500° C. for 60 seconds, followed by cold rolling to form a rolled aluminum plate having a thickness of 0.30 mm. The center line average surface roughness Ra of the plate after cold rolling was adjusted to 0.2 μm by controlling the roughness of pressure rolls. Then, the resulting plate was subjected to a tension leveler in order to improve planarity.

Then, surface treatment was conducted for obtaining a support of the lithographic printing plate.

First, in order to remove rolling oil on a surface of the aluminum plate, degreasing treatment was conducted with a 10 wt % aqueous solution of sodium aluminate at 50° C. for 30 seconds, and neutralization was performed with a 30 wt % aqueous solution of sulfuric acid at 50° C. for 30 seconds, thereby removing smuts.

Then, in order to improve adhesion between the support and the image forming layer, and to give water retention to a non-image area, so-called graining treatment was conducted for roughening the surface of the support. An anode side electrical quantity of 240 $C/dm^2$ was given with an indirect feeder cell at a current density of 20 $A/dm^2$ and an alternating wave form having a duty ratio of 1:1, while keeping an aqueous solution containing 1% by weight of nitric acid and 0.5% by weight of aluminum nitrate at 45° C. and floating an aluminum web in an aqueous solution, thereby conducting electrolytic graining. Then, etching treatment was conducted with a 10 wt % aqueous solution of sodium aluminate at 50° C. for 30 seconds, and neutralization was performed with a 30 wt % aqueous solution of sulfuric acid at 50° C. for 30 seconds, thereby removing smuts.

Further, in order to improve wear resistance, chemical resistance and water retention, an oxide film was formed on the support by anodic oxidation. An 20 wt % aqueous solution of sulfuric acid was used at 35° C. as an electrolyte, and electrolytic treatment was conducted at a direct current of 14A/$dm^2$ with an indirect feeder cell, while conveying an aluminum web in an electrolyte, thereby forming an anodic oxide film of 2.5 g/$m^2$.

Then, in order to ensure hydrophilicity as a non-image area of the printing plate, silicate treatment was conducted. In the silicate treatment, a 1.5 wt % aqueous solution of sodium tetrasilicate was maintained at 70° C., and the aluminum web was conveyed therein so as to give a contact time of the web of 15 seconds, followed by further washing. The deposit of Si was 10 mg/$^2$. The center line surface roughness Ra of support (1) prepared as described above was 0.25 μm.

Synthesis Examples of Fine Polymer Particles (1') and (3') to (8'):

As an oil phase ingredient, 6.0 g of polymer P-17 described in this specification and 0.1 g of Pionin A-41C (manufactured by Takemoto Oil & Fat Co., Ltd.) were dissolved in 18.0 g of ethyl acetate to prepare a solution, and the resulting solution was mixed with 36.0 g of a 4 wt % aqueous solution of polyvinyl alcohol (PVA205, manufactured by Kuraray Co., Ltd.), an aqueous phase ingredient. The resulting mixture was subjected to emulsification dispersion with a homogenizer at 12,000 rpm for 10 minutes. Then, 24 g of water was added, and ethyl acetate was evaporated with stirring at 60° C. for 90 minutes. The solid concentration of the resulting dispersion of fine polymer particles was 11.4% by weight, and the average particle size thereof was 0.23 μm.

Dispersions of fine polymer particles (3') to (8') were each prepared in the same manner as described above with the exception that P-21 to P-26 described in Table 2 were each used.

Synthesis Example of Fine Polymer Particles (2'):

As an oil phase ingredient, 6.0 g of P-17 described in this specification, 1.5 g of an infrared absorption dye (IR-28 described in this specification) and 0.1 g of Pionin A-41C were dissolved in 18.0 g of ethyl acetate to prepare a solution, and the resulting solution was mixed with 36.0 g of a 4 wt % aqueous solution of PVA 205, an aqueous phase ingredient. The resulting mixture was subjected to emulsification dispersion with a homogenizer at 12,000 rpm for 10 minutes. Then, 24 g of water was added, and ethyl acetate was evaporated with stirring at 60° C. for 90 minutes. The solid concentration of the resulting dispersion of fine polymer particles was 12.7% by weight, and the average particle size thereof was 0.27 μm. Synthesis Examples of Fine Polymer Particles (9') to (11')

As an oil phase ingredient, 2.0 g of compound M-59 described below, 4.0 g of polystyrene (weight average molecular weight: 40,000), 1.5 g of an infrared absorption dye (IR-12 described in this specification) and 0.1 g of Pionin A-41C were dissolved in 12.0 g of ethyl acetate and 12.0 g of MEK to prepare a solution, and the resulting solution was mixed with 36.0 g of a 4 wt % aqueous solution of PVA 205, an aqueous phase ingredient. The resulting mixture was subjected to emulsification dispersion with a homogenizer at 12,000 rpm for 10 minutes. Then, 24 g of water was added, and ethyl acetate was evaporated with stirring at 60° C. for 90 minutes. The solid concentration of the resulting dispersion of fine polymer particles (9') was 11.1% by weight, and the average particle size thereof was 0.28 μm.

A dispersion of fine polymer particles (10') was prepared in the same manner as described above with the exception that polystyrene was substituted by polymethyl methacrylate (weight average molecular weight: 25,000).

Further, a dispersion of fine polymer particles (11') was prepared in the same manner as described above with the exception that compound M-59 was substituted by M-11.

Synthesis Examples of Microcapsules (1') and (7'):

As an oil phase ingredient, 40 g of Takenate D-110N, 10 g of a bifunctional vinyloxy compound (M-11 described in this specification) and 0.1 g of Pionin A-41C were dissolved in 60 g of ethyl acetate to prepare a solution. As an aqueous phase ingredient, 120 g of a 4 wt % aqueous solution of PVA 205 was prepared. The oil phase ingredient and the aqueous phase ingredient were emulsified with a homogenizer at 15,000 rpm for 10 minutes. Then, 40 g of water was added, followed by stirring at room temperature for 30 minutes, and further at 40° C. for 3 hours. The solid concentration of the dispersion of microcapsules (1') thus obtained was 18.2% by weight, and the average particle size thereof was 0.31 μm.

A dispersion of microcapsules (7') was prepared in the same manner as described above with the exception that the vinyloxy compound was substituted by P-11 described in this specification.

Synthesis Examples of Microcapsules (2') to (6'), (8') and (10') to (12')

As an oil phase ingredient, 40 g of Takenate D-110N, 10 g of a bifunctional vinyloxy compound (M-11 described in this specification), 1.5 g of an infrared absorption dye (IR-28 described in this specification) and 0.1 g of Pionin A-41C were dissolved in 60 g of ethyl acetate to prepare a solution. As an aqueous phase ingredient, 120 g of a 4 wt % aqueous solution of PVA205 was prepared. The oil phase ingredient and the aqueous phase ingredient were emulsified with a homogenizer at 15,000 rpm for 10 minutes. Then, 40 g of water was added, followed by stirring at room temperature for 30 minutes, and further at 40° C. for 3 hours. The solid concentration of the solution of microcapsules (2') thus obtained was 19.6% by weight, and the average particle size thereof was 0.35 μm. Dispersions of microcapsules (3') to (6'), (8') and (10') to (12') were each prepared in the same manner as described above with the exception that the vinyloxy compound was substituted by each compound described in Table 2 shown below.

Synthesis Example of Microcapsules (9'):

As an oil phase ingredient, 40 g of Takenate D-110N, 5.0 g of a bifunctional vinyloxy compound (M-11 described in this specification), 5.0 g of a vinyloxy compound (P-11 described in this specification), 1.5 g of an infrared absorption dye (IR-28 described in this specification) and 0.1 g of Pionin A-41C were dissolved in 60 g of ethyl acetate to prepare a solution. As an aqueous phase ingredient, 120 g of a 4 wt % aqueous solution of PVA205 was prepared. The oil phase ingredient and the aqueous phase ingredient were emulsified with a homogenizer at 15,000 rpm for 10 minutes. Then, 40 g of water was added, followed by stirring at room temperature for 30 minutes, and further at 40° C. for 3 hours. The solid concentration of the dispersion of microcapsules (9') thus obtained was 17.3% by weight, and the average particle size thereof was 0.45 μm.

Synthesis Example of Microcapsule (13'):

As an oil phase ingredient, 40 g of Takenate D-110N, 10 g of a bifunctional vinyloxy compound (M-11 in the specification of the present invention), 1.4 g of an acid precursor (A-14 in the specification of the present invention), and 0.1 g of Pionin A41C were dissolved in 60 g of ethyl acetate to prepare a solution. As an aqueous phase ingredient, 120 g of a 4% aqueous solution of PVA205 was prepared. The oil phase ingredient and the aqueous phase ingredient were emulsified with a homogenizer at 15,000 rpm for 10 minutes. Then, 40 g of water was added, followed by stirring at room temperature for 30 minutes, and further at 40° C. for 3 hours. The solid concentration of the dispersion of microcapsule (13') thus obtained was 16.5% by weight, and the average particle size thereof was 0.34 μm.

Examples II-1 to II-17 and Comparative Examples II-1 to II-4:

Coating solutions (1') and (2') for image forming layers having the following compositions containing fine particle ingredients selected from polymer particles (1') to (12') and microcapsules (1') to (10') obtained in the synthesis examples were prepared in combinations shown in Table 2. Then, each of the resulting coating solutions was applied by bar coating onto the support obtained in the above-mentioned production example, and dried in an oven at 80° C. for 90 seconds to prepare a lithographic printing prate precursor in which an image forming layer was formed in a dry amount coated of 1.0 $g/m^2$.

Coating Solution (1') for Image forming layer (Containing Infrared Absorption Dye in Matrix of Image forming layer), Examples II-1, II-3 and II-11:

| | |
|---|---|
| Water | 100 g |
| Microcapsules (in terms of solid content) | 5 g |
| Fine polymer particles or microcapsules (in terms of solid content) | 5 g |
| Infrared absorption dye (IR-12 described in this specification) | 0.5 g |
| Acid precursor (A-21 described in this specification) | 0.5 g |

Coating Solution (2') for Image forming layer, Examples II-2, II-4 to II-10 and II-12 to II-16, and Comparative Examples II-1 to II-3:

| | |
|---|---|
| Water | 100 g |
| Microcapsules (in terms of solid content) | 5 g |
| Fine polymer particles or microcapsules (in terms of solid content) | 5 g |
| Acid precursor (A-21 described in this specification) | 0.5 g |

Coating Solution (3') for Image-Forming Layer Comparative Example II-4:

| | |
|---|---|
| Water | 100 g |
| Microcapsules (in terms of solid content) | 5 g |
| Fine resin particles (in terms of solid content) | 5 g |

The lithographic printing plate precursors obtained in Examples II-1 to II-17 and Comparative Examples II-1 to II-3 were each exposed with a Trend setter (3244 VFS, manufactured by Creo) equipped with a water-cooling type 40-W infrared semiconductor laser under the following conditions, that is, at an output of 9 W, at an outer drum revolution of 210 rpm, at a plate face energy of 100 $mJ/m^2$ and at a resolution of 2,400 dpi, and then, mounted on a printing machine (SOR-M, manufactured by Heidelberg) without development processing. After a fountain solution was supplied, ink was supplied, and paper was further supplied to do printing.

As a result, for the printing plate precursors of all examples, the on-machine development was possible without problems, and printable. The insolubilization rate (unit: % by weight) of an image area at the time when each printing plate precursor was immersed and eluted in MEK for 10 minutes, and the number of printable sheets were shown in Table 2. The higher insolubilization rate results in higher crosslinking density to cause higher printing durability.

Further, for evaluating the stability (i.e., the aging stability) with the lapse of time, after the printing plate precursors had been forcedly aged at 60° C. for three days, printing was performed on machine by supplying a fountain solution and ink in the same manner as above, and the number of sheets of the printing paper lost (the number of the sheets by on-press development) until a good printed matter could be obtained was counted. The more excellent the aging stability of the printing plate precursor, the fewer is the number of the sheets by on-press development.

TABLE 2

| Example No. | Microcapsules | Fine Resin Particles | IR Dye | Insolubi-lization Rate (%) | Number of Printable Sheets | Number of Sheets by On-Press Development after Forced Aging |
|---|---|---|---|---|---|---|
| II-1 | M-11 (1) | P-17 (1) | IR-12 | 51 | 20,000 | 12 |
| II-2 | M-11 + IR28 (2) | P-17 (1) | — | 68 | 25,000 | 12 |
| II-3 | M-11 + IR28 (2) | P-17 (1) | IR-12 | 66 | 25,000 | 10 |
| II-4 | M-11 + IR28 (2) | P-17 + IR28 (2) | — | 71 | 25,000 | 10 |
| II-5 | M-8 + IR28 (3) | P-21 (3) | — | 69 | 30,000 | 10 |
| II-6 | M-24 + IR28 (4) | P-22 (4) | — | 63 | 20,000 | 12 |
| II-7 | M-32 + IR28 (5) | P-23 (5) | — | 75 | 20,000 | 10 |
| II-8 | M-40 + IR28 (6) | P-24 (6) | — | 72 | 25,000 | 10 |
| II-9 | M-11 + IR28 (2) | P-25 (7) | — | 66 | 30,000 | 12 |
| II-10 | M-11 + IR28 (2) | P-26 (8) | — | 63 | 25,000 | 12 |
| II-11 | P-11 (7) | P-17 (1) | IR-12 | 70 | 25,000 | 10 |
| II-12 | P-11 + IR28 (8) | P-17 (1) | — | 64 | 20,000 | 10 |
| II-13 | M-11 + P-11 + IR28 (9) | P-17 (1) | — | 61 | 25,000 | 12 |
| II-14 | M-11 + IR28 (2) | M-59 + Polystyrene + IR28 (9) | — | 77 | 25,000 | 10 |
| II-15 | P-11 + IR28 (8) | M-59 + Polystyrene + IR28 (9) | — | 73 | 30,000 | 10 |
| II-16 | P-14 + IR28 (10) | M-59 + PMMA + IR28 (10) | — | 70 | 25,000 | 10 |
| II-17 | M-11 + Polystyrene + IR28 (11) | P-17 (1) | — | 65 | 25,000 | 10 |
| Comparative Example II-1 | Monofunctional vinyl ether M-58 + IR28 (12) | P-17 (1) | — | 32 | 5,000 | 12 |
| Comparative Example II-2 | — | P-17 + IR28 (2) | — | 0 | 7,000 | 12 |
| Comparative Example II-3 | M-57 + IR28 (11) | P-17 (1) | — | 32 | 5,000 | 12 |
| Comparative Example II-4 | M-11 + A-14 (13) | P-17 (1) | IR-12 | 50 | 20,000 | 100 or more |

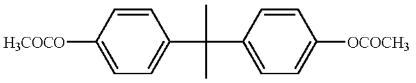

(M-57)

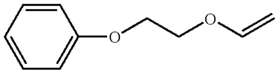

(M-58)

As shown in the above results, it is clear that the lithographic printing plate precursors using microcapsules encapsulating a compound having two or more vinyloxy groups or fine particles containing a compound having two or more vinyloxy groups have higher insolubilization rate to solvent and high printing durability.

Further, from Comparative Example II-4, it is clear that the aging stability is excellent in the lithographic printing plate precursors according to the present invention wherein the acid precursor is not contained in microcapsules but contained in the hydrophilic resin in the image-forming layer.

According to the present invention, there can be provided the lithographic printing plate precursors in which plate-making by scanning exposure based on digital signals is possible, and which have good on-machine development quality, and moreover high sensitivity, high printing durability and good aging stability.

The entitle disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising a support having provided thereon an image forming layer containing (1) at least one ingredient selected from the group consisting of fine particles containing a compound having two or more vinyloxy groups and microcapsules encapsulating a compound having two or more vinyloxy groups, (2) a light-to-heat conversion agent, (3) a hydrophilic resin, (4) an acid precursor, and (5) fine resin particles containing a compound having a functional group which is crosslinked with the vinyloxy group by heat, and wherein the acid precursor is not contained in the fine particles or microcapsules.

2. The lithographic printing plate precursor as claimed in claim 1, wherein the (1) fine resin particles or microcapsules encapsulate (2) the light-to-heat conversion agent.

3. The lithographic printing plate precursor as claimed in claim 1, wherein the light-to-heat conversion agent is a cyanine dye.

4. The lithographic printing plate precursor as claimed in claim 1, wherein the acid precursor is an onium salt compound.

5. The lithographic printing plate precursor as claimed in claim 1, wherein the functional group crosslinked with the vinyloxy group by heat is an acidic group or a hydroxyl group.

* * * * *